United States Patent
Kurosaki et al.

(10) Patent No.: US 10,497,848 B2
(45) Date of Patent: Dec. 3, 2019

(54) THERMOELECTRIC CONVERSION MATERIAL

(71) Applicant: Hitachi, Ltd., Chiyoda-ku, Tokyo (JP)

(72) Inventors: Yosuke Kurosaki, Tokyo (JP); Naoto Fukatani, Tokyo (JP); Jyun Hayakawa, Tokyo (JP); Akinori Nishide, Tokyo (JP); Shin Yabuuchi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 250 days.

(21) Appl. No.: 15/547,636

(22) PCT Filed: May 29, 2015

(86) PCT No.: PCT/JP2015/065573
§ 371 (c)(1),
(2) Date: Jul. 31, 2017

(87) PCT Pub. No.: WO2016/194047
PCT Pub. Date: Dec. 8, 2016

(65) Prior Publication Data
US 2018/0026171 A1    Jan. 25, 2018

(51) Int. Cl.
*H01L 35/20* (2006.01)
*C22C 38/00* (2006.01)
(Continued)

(52) U.S. Cl.
CPC ............. *H01L 35/20* (2013.01); *C22C 38/00* (2013.01); *C22C 38/06* (2013.01); *C22C 38/12* (2013.01);
(Continued)

(58) Field of Classification Search
CPC ......... H01L 35/00; H01L 35/20; H01L 37/00; C22C 38/00; C22C 38/02; C22C 38/04;
(Continued)

(56) References Cited

U.S. PATENT DOCUMENTS

2008/0092940 A1    4/2008  Nakajima
2008/0236644 A1*  10/2008  Sakurada ............... C22C 30/00
                                                          136/239

(Continued)

FOREIGN PATENT DOCUMENTS

JP    2004-253618 A    9/2004
JP    2006-203186 A    8/2006
(Continued)

OTHER PUBLICATIONS

International Search Report (PCT/ISA/210) issued in PCT Application No. PCT/JP2015/065573 dated Jul. 7, 2015 with English translation (5 pages).
(Continued)

*Primary Examiner* — Alexandra M Moore
(74) *Attorney, Agent, or Firm* — Crowell & Moring LLP

(57) ABSTRACT

Provided is a thermoelectric conversion material formed from a full Heusler alloy represented by the composition formula: $Fe_{2+\alpha}(Ti_{1-\beta}M1_\beta)_{1-\alpha+\gamma}(Al_{1-\delta}M2_\delta)_{1-\gamma}$. M1 represents at least one element selected from the group consisting of V, Nb and Ta, and M2 represents at least one element selected from the group consisting of Group 13 elements except for Al and Group 14 elements. α satisfies the relation: $0<\alpha\leq0.42$, β satisfies the relation: $0\leq\beta<0.75$, and δ satisfies the relation: $0\leq\delta<0.5$. The valence electron concentration, VEC, satisfies the relation: $5.91\leq VEC<6.16$.

3 Claims, 9 Drawing Sheets

(51) Int. Cl.
  *C22C 38/14* (2006.01)
  *C22C 38/06* (2006.01)
  *C22C 38/12* (2006.01)
  *C23C 14/18* (2006.01)
  *B22F 3/02* (2006.01)
  *B22F 3/10* (2006.01)
  *C22C 33/02* (2006.01)

(52) U.S. Cl.
  CPC ............ *C22C 38/14* (2013.01); *C23C 14/185* (2013.01); *B22F 3/02* (2013.01); *B22F 3/10* (2013.01); *C22C 33/0207* (2013.01); *C22C 33/0257* (2013.01); *C23C 14/18* (2013.01)

(58) Field of Classification Search
  CPC ......... C22C 38/06; C22C 38/12; C22C 38/14; C22C 33/0207; C22C 33/0257; C23C 14/18; C23C 14/185; B22F 3/00; B22F 3/02; B22F 3/10
  See application file for complete search history.

(56) References Cited

U.S. PATENT DOCUMENTS

| | | | | |
|---|---|---|---|---|
| 2013/0014798 A1* | 1/2013 | Nishide | ............... | H01L 35/20 |
| | | | | 136/205 |
| 2014/0345663 A1* | 11/2014 | Hayakawa | ............. | H01L 35/14 |
| | | | | 136/205 |
| 2015/0179909 A1 | 6/2015 | Nishide et al. | | |

FOREIGN PATENT DOCUMENTS

| | | | | |
|---|---|---|---|---|
| JP | 2008-21982 A | 1/2008 | | |
| JP | 2008-218896 A | 9/2008 | | |
| JP | 2013-89882 A | 5/2013 | | |
| WO | WO-2013093967 A1 * | 6/2013 | ............ | H01L 35/14 |
| WO | WO 2013/175571 A1 | 11/2013 | | |

OTHER PUBLICATIONS

Japanese-language Written Opinion (PCT/ISA/237) issued in PCT Application No. PCT/JP2015/065573 dated Jul. 7, 2015 (3 pages).

Suzuki et al., "Thermoelectric Properties of $Fe_2$ TiAl Heusler Alloys", Journal of Alloys and Compounds, 2004, pp. 38-42, vol. 377.

Prakash et al., "Structure and Properties of Fe—Al—Ti Intermetallic Alloys", Intermetallics, 2001, pp. 107-112, vol. 9.

* cited by examiner

THERMOELECTRIC CONVERSION MATERIAL

TECHNICAL FIELD

The present invention relates to a thermoelectric conversion material.

BACKGROUND ART

In recent years, there is a demand for technical innovation for $CO_2$ reduction in relation to the phenomenon of global warming, and attention has been paid to new energy utilization technologies for suppressing the amount of use of energy resources. One of the candidate technologies is a technology involving the use of natural energy such as sunlight and wind power as energy sources, and another promising candidate technology is a technology of reutilizing the loss of energy resources.

Under the current circumstances of energy utilization, about 60% of primary energy is dissipated as heat, and thus it is required to reutilize this industrial waste heat as electric power. Regarding the technology for converting waste heat to electric power, a conversion technology of using a turbine is generally used. However, in a region with a low heat density or in a region where it is spatially difficult to design a turbine, conversion technologies of using a thermoelectric conversion module that utilizes the Seebeck effect have been suggested.

In the thermoelectric conversion technologies, thermoelectric conversion modules that include thermoelectric conversion materials are used. Furthermore, among the thermoelectric conversion materials, as thermoelectric conversion materials having temperature characteristics that are applicable to waste heat recovery at 200° C. or lower, full Heusler alloys are used.

JP 2013-89882 A (PTL 1) discloses that when the chemical composition ratio of Fe and V in the basic structure of $Fe_2VAl$ is adjusted to an adjustment amount within a particular range, and some of the constituent elements are substituted with other elements, the absolute value of the Seebeck coefficient can be increased.

WO 2013/175571 A1 (PTL 2) discloses that the material of a thermoelectric conversion unit included in a thermoelectric conversion module includes Fe, Ti, and at least any one of Si and Sn.

NPL 1 describes the thermoelectric conversion characteristics of a $Fe_2TiAl$ Heusler alloy. Also, NPL 2 describes the structures and mechanical characteristics of Fe—Al—Ti alloys, and it is described therein that Fe—Al—Ti alloys exhibit a microstructure that includes $Fe_2TiAl$, depending on the composition.

CITATION LIST

Patent Literature

PTL 1: JP 2013-89882 A
PTL 2: WO 2013/175571 A1

Non-Patent Literature

NPL 1: R. O. Suzuki et al., Journal of Alloys and Compounds, 377, 38-42 (2004)
NPL 2: U. Prakash et al., Intermetallics, 9, 107-112 (2001)

SUMMARY OF INVENTION

Technical Problem

In order to increase the power output of a thermoelectric conversion module including a thermoelectric conversion material, for example, it is desirable to increase the Seebeck coefficient of the thermoelectric conversion material. However, in regard to thermoelectric conversion materials including full Heusler alloys, a thermoelectric conversion material that has a high Seebeck coefficient and is inexpensive and capable of reducing environmental burdens, has not yet been obtained.

It is an object of the present invention to provide a thermoelectric conversion material including a full Heusler alloy, which has a high Seebeck coefficient and is inexpensive and capable of reducing environmental burdens.

The above-described object and other objects of the present invention as well as novel features of the present invention will be disclosed in the description of the present specification and the attached drawings.

Solution to Problem

Among the inventions disclosed in the present invention, a representative summary will be simply described below.

A thermoelectric conversion material according to a representative embodiment includes a full Heusler alloy represented by the following composition formula (Formula 1):

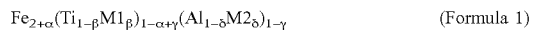
$$Fe_{2+\alpha}(Ti_{1-\beta}M1_{\beta})_{1-\alpha+\gamma}(Al_{1-\delta}M2_{\delta})_{1-\gamma} \quad \text{(Formula 1)}$$

M1 represents at least one element selected from the group consisting of V, Nb and Ta, and M2 represents at least one element selected from the group consisting of the Group 13 elements except for Al and the Group 14 elements. $\alpha$ satisfies the relation: $0<\alpha\leq0.42$, $\beta$ satisfies the relation: $0\leq\beta<0.75$, and $\delta$ satisfies the relation: $0\leq\delta<0.5$. The number of valence electrons of M1 is designated as m1, and the number of valence electrons of M2 is designated as m2. At this time, the VEC, which is the valence electron concentration per atom of a full Heusler alloy, is a function of $\alpha$, $\beta$, $\gamma$, and $\delta$, and is represented by the following mathematical formula (Expression 1). The VEC satisfies the relation: $5.91\leq VEC<6.16$.

$$VEC(\alpha,\beta,\gamma,\delta)=[8\times(2+\alpha)+\{4\times(1-\beta)+m1\times\beta\}\times(1-\alpha+\gamma)+\{3\times(1-\delta)+m2\times\delta\}\times(1-\gamma)]/4 \quad \text{(Expression 1)}$$

Furthermore, a thermoelectric conversion material according to a representative embodiment includes a full Heusler alloy represented by the following composition formula (Formula 2):

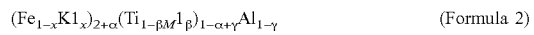
$$(Fe_{1-x}K1_x)_{2+\alpha}(Ti_{1-\beta}M1_{\beta})_{1-\alpha+\gamma}Al_{1-\gamma} \quad \text{(Formula 2)}$$

K1 represents at least one element selected from the group consisting of Group 7 elements, Group 8 elements except for Fe, and Group 9 elements, and M1 represents at least, one element selected from the group consisting of V, Nb and Ta. x satisfies the relation: $0<x<0.5$, $\alpha$ satisfies the relation: $0<\alpha\leq0.42$, and $\beta$ satisfies the relation: $0\leq\beta<0.75$. The number of valence electrons of K1 is designated as k1, and the number of valence electrons of M1 is designated as m1. At this time, the VEC, which is the valence electron concentration per atom of a full Heusler alloy, is a function of x, $\alpha$, $\beta$, and $\gamma$, and is represented by the following mathematical formula (Expression 2). The VEC satisfies the relation: $5.91\leq VEC<6.16$.

$$VEC(x,\alpha,\beta,\gamma)=[\{8\times(1-x)+k1\times x\}\times(2+\alpha)+\{4\times(1-\beta)+m1\times\beta\}\times(1-\alpha+\gamma)+3\times(1-\gamma)]/4 \quad \text{(Expression 2)}$$

Furthermore, a thermoelectric conversion material according to another representative embodiment includes a full Heusler alloy represented by the following compositional formula (Formula 3):

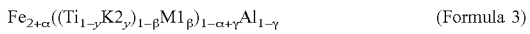
$$Fe_{2+\alpha}((Ti_{1-y}K2_y)_{1-\beta}M1_\beta)_{1-\alpha+\gamma}Al_{1-\gamma} \quad \text{(Formula 3)}$$

K2 represents at least, one element, selected from, the group consisting of Group 4 elements except for Ti, Group 6 elements, and Group 7 elements, and M1 represents at least one element selected from the group consisting of V, Mb and Ta. y satisfies the relation: $0<y<0.5$, $\alpha$ satisfies the relation: $0<\alpha\leq0.42$, and $\beta$ satisfies the relation: $0\leq\beta<0.75$. The number of valence electrons of K2 is designated as k2, and the number of valence electrons of M1 is designated, as m1. At this time, the VEC, which is the valence electron concentration per atom of a full Heusler alloy, is a function of y, $\alpha$, $\beta$, and $\gamma$, and is represented by the following mathematical formula (Expression 3). The VEC satisfies the relation: $5.91\leq VEC<6.16$.

$$VEC(y,\alpha,\beta,\gamma)=[8\times(2+\alpha)+\{4\times(1-y)\times(1-\beta)+k2\times y\times(1-\beta)+m1\times\beta\}\times(1-\alpha+\gamma)+3\times(1-\gamma)]/4 \quad \text{(Expression 3)}.$$

Advantageous Effects of Invention

The effects obtainable by representative embodiments among the inventions disclosed in the present application may be simply described as follows.

According to representative embodiments, thermoelectric conversion materials including full Heusler alloys, which have high Seebeck coefficients, and are inexpensive and capable of reducing environmental burdens, can be provided.

DESCRIPTION OF EMBODIMENTS

Figure 1:
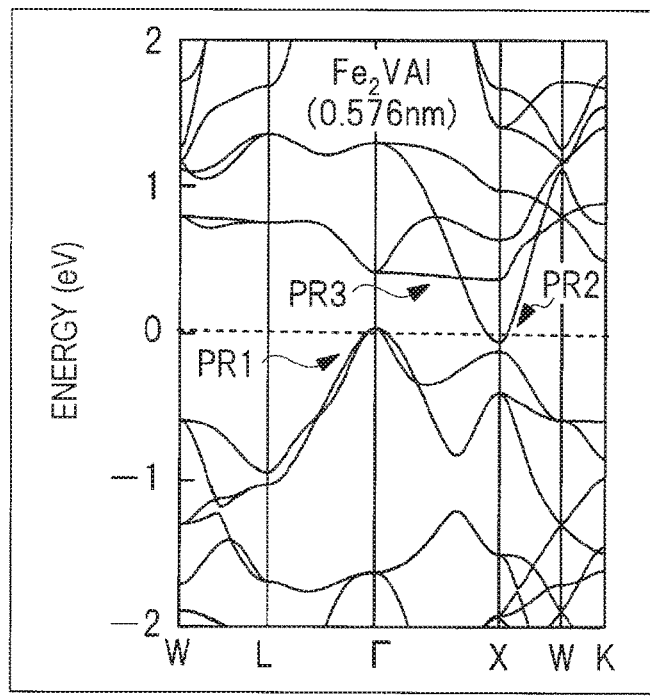
FIG. 1 is a diagram illustrating the band structure of a full Heusler alloy calculated by the first principle calculation.

In regard to the following embodiments, for convenience, the invention will be described dividedly in a plurality of sections or embodiments as needed; however, unless particularly specified otherwise, those sections or embodiments are not irrelevant to each other, and they are related to one another such that one embodiment is a modification example, a detailed description, a supplementary description or the like of a part or the entirety of the other embodiments.

In regard to the following embodiments, in a case in which an embodiment is mentioned with the number or the like of an element (including the number of pieces, a numerical value, an amount, a range, or the like), the embodiment is not intended to be limited by the particular number, and the number may be larger than or equal to a particular number, or may be smaller than or equal to the particular number, except for the case in which the number and the like are particularly specified otherwise and the case in which the element is obviously limited by a particular number in principle.

Furthermore, in the following embodiments, it is obvious that the constituent elements thereof (also including element steps and the like) are not necessarily essential, except for the case in which the constituent elements are particularly specified otherwise and the case in which the elements are considered obviously essential in principle. Similarly, in regard to the following embodiments, when the shape, positional relation, and the like of constituent elements and the like are mentioned, shapes that are substantially close or similar to the very shape, and the like are also included, except for the case in which the constituent elements are particularly specified otherwise and the case in which the elements are considered obviously different in principle. This also applies to the numerical value and range described above.

In the following description, embodiments of the present invention will be described in detail with reference to the drawings. In all of the diagrams for describing the embodiments, members having the same function will be assigned with the same symbol, and a description thereof will not be repeated here. In the following embodiments, unless particularly needed, description of the same parts or similar parts will not be repeated in principle.

In the following embodiments, when a range is expressed as A to B, the range is to describe a range of from A to B, unless particularly specified otherwise.

Embodiment 1

Figure of Merit of Thermoelectric Conversion Material

A thermoelectric conversion module is disposed close to a heat source and converts heat to electric power as a temperature difference occurs within the thermoelectric conversion module, such as in a vertical direction of the thermoelectric conversion module. A thermoelectric conversion module has a p-type thermoelectric conversion material, an n-type thermoelectric conversion material, and an electrode, and utilizes the Seebeck effect of the thermoelectric conversion materials. The thermoelectric conversion efficiency of this thermoelectric conversion module strongly depends on the thermoelectric conversion material. Therefore, in order to increase the thermoelectric conversion efficiency, it is desirable to enhance the thermoelectric conversion characteristics of the thermoelectric conversion material. The thermoelectric conversion characteristics of a thermoelectric conversion material that utilizes this Seebeck effect are generally evaluated on the basis of the dimensionless figure of merit ZT represented by the following mathematical formula (Expression 4). In the following description, the "dimensionless figure of merit" is also simply referred to as "figure of merit".

The figure of merit ZT is represented by the following mathematical formula (Expression 4):

$$ZT=\{S^2/(\kappa\rho)\}T \quad \text{(Expression 4)}$$

Here, S represents the Seebeck coefficient; $\rho$ represents specific resistance (electrical resistivity); $\kappa$ represents thermal conductivity; and T represents temperature (absolute temperature). As the figure of merit ZT is larger, the thermoelectric conversion efficiency of the thermoelectric conversion module becomes higher. Furthermore, the temperature range in which the figure of merit ZT has the maximum value strongly depends on the thermoelectric conversion material. Therefore, it is desirable to select a thermoelectric conversion material that is appropriate for the temperature range in which the thermoelectric conversion module is used.

As is obvious from the mathematical formula (Expression 4), in order to enhance the thermoelectric conversion characteristics of the thermoelectric conversion material, it is desirable to increase the Seebeck coefficient S, and to decrease the specific resistance $\rho$ and the thermal conductivity $\kappa$. However, generally, as the number of carriers of the thermoelectric conversion material is larger, the Seebeck coefficient S becomes smaller, the specific resistance $\rho$ becomes smaller, and the thermal conductivity $\kappa$ becomes larger. Thus, the Seebeck coefficient S, the specific resistance $\rho$, and the thermal conductivity $\kappa$ correlate with one another and are in a trade-off relationship. As a result, a thermoelectric conversion material having a high figure of merit ZT to the extent that the thermoelectric conversion material can endure practical use has not yet been found.

About 60% of industrial waste heat is concentrated within a temperature range at a low temperature of 200° C. or lower; however, regarding a thermoelectric conversion material that has the maximum value for the figure of merit ZT in such a low temperature region and has a figure of index ZT of more than 1, which serves as the standard for practical usability, only a thermoelectric conversion material including BiTe compounds has been discovered. However, since Bi and Te are both expensive and rare, and Te is strongly toxic, in the case of using a BiTe compound as the thermoelectric conversion material, it is difficult to achieve mass production of the thermoelectric conversion material, cost reduction for the thermoelectric conversion material, and reduction of environmental burdens. Therefore, there is a demand for a highly efficient thermoelectric conversion material that may substitute a BiTe compound.

On the other hand, as a material that satisfies the characteristics of having a high figure of merit ZT similarly to BiTe compounds, being inexpensive compared to BiTe compounds, and being non-toxic unlike BiTe compounds, full Heusler alloys may be mentioned.

As described above, it is disclosed in PTL 1 that in regard to the basic structure of $Fe_2VAl$, when the chemical composition ratio of Fe and V is adjusted to an adjustment amount within a particular range, and some of the constituent elements are substituted with other elements, the absolute value of the Seebeck coefficient can be increased. Furthermore, it is disclosed in PTL 2 that the material of a thermoelectric conversion unit installed in a thermoelectric conversion module includes Fe, Ti, and at least any one of Si and Sn. NPL 1 describes the thermoelectric conversion characteristics of $Fe_2TiAl$ Heusler alloys, and NPL 2 describes the structure and mechanical characteristics of Fe—Al—Ti alloys.

A thermoelectric conversion material including a full Heusler alloy is a promising thermoelectric conversion material that can be used at low temperature, and has a feature of having low specific resistance $\rho$. However, in order for a thermoelectric conversion material including a full Heusler alloy to have superior thermoelectric conversion characteristics, it is desirable to further increase the Seebeck coefficient S, and it is desirable to lower the thermal conductivity $\kappa$.

Above all, in order to increase the Seebeck coefficient S of a thermoelectric conversion material including a full Heusler alloy, it is necessary that, the three conditions described below are satisfied.

A first condition is that the composition of the thermoelectric conversion material is a composition in which a full Heusler alloy exists stably. A full Heusler alloy is a multi-component alloy formed from three or more element components. Therefore, the range of the composition in which the full Heusler alloy exists stably is limited compared to the range of the composition in which a binary alloy exists stably.

A second condition is that there is an energy gap between the conduction band and the valence band. If there is no energy gap between the conduction band and the valence band, even if the carrier density is small, the thermoelectromotive forces produced by holes and electrons cancel each other, and therefore, it is difficult to obtain a large Seebeck coefficient S.

A third condition is that the valence electron concentration (VEC) per atom, that is, the average value of the number of electrons in the outermost shell of a single atom is close to 6. In a full Heusler alloy, when the valence electron concentration per atom, VEC, is 6, carriers are lost; however, when the valence electron concentration per atom, VEC, is too far from the value of 6, the alloy becomes a metal with an excess amount of carriers, and it is difficult to obtain a large Seebeck coefficient S.

Here, the valence electron concentration per atom, VEC, is a value obtained by dividing the total number of valence electrons Z of the compound by the number of atoms a in a unit cell. In the following description, the "valence electron concentration per atom" may also be simply referred to as "valence electron concentration".

Examples of the thermoelectric conversion material including a full Heusler alloy include $Fe_2VAl$, $Fe_2TiSi$, and $Fe_2TiAl$.

$Fe_2VAl$ exists stably as a ternary alloy and has a valence electron concentration, VEC, of 6. However, since $Fe_2VAl$ is a semimetal, it is difficult to obtain a large Seebeck coefficient S.

Fe$_2$TiSi has a relatively large band gap such as 0.4 eV, and has a valence electron concentration, VEC, of 6. However, this alloy is unstable as a ternary alloy, and is not likely to exist stably.

In regard to Fe$_2$TiAl, the structure has been examined in NPL 2, and Fe$_2$TiAl as a ternary alloy can easily co-exist with a binary alloy, Fe$_2$Ti, which is a metal. Furthermore, although Fe$_2$TiAl has an energy gap between the conduction band and the valence band, since the valence electron concentration, VEC, is 5.75, it is difficult to obtain a large Seebeck coefficient S.

Under such circumstances, the inventors employed Fe$_2$TiAl as a full Heusler alloy having a L2$_1$ type crystal structure represented by E1$_2$E2E3 as a parent material, as the thermoelectric conversion material of the present Embodiment 1. Then, the content of Fe (iron), which is a first element that mainly occupies E1 sites; the type and amount of the substituent element that substitutes a portion of Ti (titanium), which is a second element that mainly occupies E2 sites; and the content of Al (aluminum), which is a third element that mainly occupies E3 sites, were defined. In the description given below, the dependency of the Seebeck coefficient on the valence electron concentration in a full Heusler alloy, and the substituent element that increases the energy gap will be described, and then a suitable range of the composition of the thermoelectric conversion material of the present Embodiment 1 will be described. In the following description, a full Heusler alloy having Fe$_2$TiAl as a parent material may also be referred to as a Fe$_2$TiAl-based full Heusler alloy.

Dependency of Seebeck Coefficient on Valence Electron Concentration

First, the dependency of the Seebeck coefficient of a full Heusler alloy on the valence electron concentration will be described. FIG. 1 is a diagram illustrating the band structure of a full Heusler alloy calculated by the first principle calculation. FIG. 1 illustrates a band structure of a full Heusler alloy represented by the composition formula: Fe$_2$VAl. In the following description, the full Heusler alloy represented by the composition formula: Fe$_2$VAl may be simply referred to as Fe$_2$VAl.

As illustrated in FIG. 1, in the band structure of a full Heusler alloy represented by the composition formula: Fe$_2$VAl, there exist PR1, which is a part that has an upward convex shape and functions as a hole pocket; and PR2, which is a part that has a downward convex shape and functions as an electron pocket. From this, it is understood that the electron state of this full Heusler alloy is a semimetal state in which two kinds of carriers such as holes and electrons exist.

Figure 2:
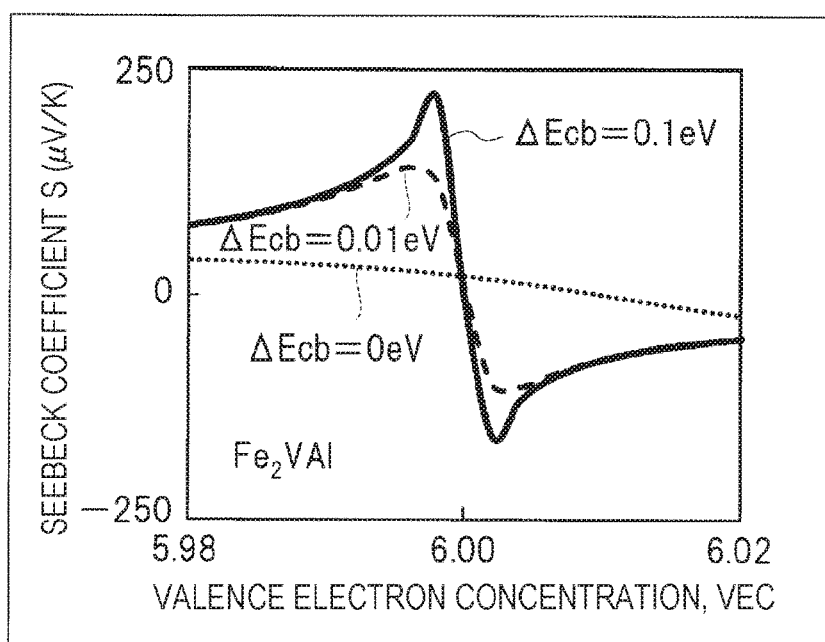
FIG. 2 is a graph showing the dependency of the Seebeck coefficient of a full Heusler alloy obtained by the first principle calculation, on the valence electron concentration.

FIG. 2 is a graph showing the dependency of the Seebeck coefficient of a full Heusler alloy obtained by the first principle calculation, on the valence electron concentration. FIG. 2 shows the Seebeck coefficient of a full Heusler alloy represented by the composition formula: Fe$_2$VAl. Here, calculation was performed also for the case in which the energy of the conduction band of a full Heusler alloy had been artificially shifted to a higher energy level. As shown in FIG. 2, while the shift amount of the energy of the conduction band was designated as ΔEcb, calculation was performed for three occasions of ΔEcb=0 eV, ΔEcb=0.01 eV, and ΔEcb=0.1 eV. Therefore, the graph of FIG. 2 also shows the dependency of the Seebeck coefficient on the energy gap.

Meanwhile, in the occasion in which ΔEcb=0 eV, it is implied that the energy of the conduction band of the full Heusler alloy is not shifted.

As shown in FIG. 2, in a case in which the valence electron concentration, VEC, is 6, the Seebeck coefficient S is approximately equal to 0, and carriers are lost. On the other hand, in a case in which the valence electron concentration, VEC, is less than 6, the symbol of the Seebeck coefficient S becomes positive (p-type), and in a case in which the valence electron concentration, VEC, is greater than 6, the symbol of the Seebeck coefficient S becomes negative (n-type). That is, between the case in which the valence electron concentration, VEC, is less than 6, and the case in which the valence electron concentration, VEC, is greater than 6, the symbol of the Seebeck coefficient S is reversed. Also, in the case in which the valence electron concentration, VEC, is less than 6, as well as in the case in which the valence electron concentration, VEC, is more than 6, the absolute value of the Seebeck coefficient S reaches the maximum when the valence electron concentration, VEC, is approximately 6. However, since the electron state of a full Heusler alloy represented by the composition formula: Fe$_2$VAl is a semimetal state as described above, and the thermoelectromotive forces of holes and electrons cancel each other, the absolute value of the Seebeck coefficient S is low irrespective of the valence electron concentration, VEC.

On the other hand, in regard to FIG. 2, when a comparison is made between the three occasions of ΔEcb=0 eV, ΔEcb=0.01 eV, and ΔEcb=0.1 eV, the effect in which the thermoelectromotive forces of holes and electrons cancel each other is reduced along with an increase in the energy gap, and therefore, the absolute value of the Seebeck coefficient S increases. Therefore, in order to obtain a high Seebeck coefficient S for a full Heusler alloy, it is desirable to select a full Heusler alloy having a large band gap, and to adjust the valence electron concentration, VEC, of the selected full Heusler alloy to be approximately 6.

The valence electron concentration, VEC, can be determined by experimentally measuring the composition of the full Heusler alloy. Furthermore, as the method for experimentally measuring the composition of the full Heusler alloy, as will be described below, energy dispersive X-ray spectrometry (EDX) or inductively coupled plasma (TCP) emission spectrometry can be used.

Figure 3:
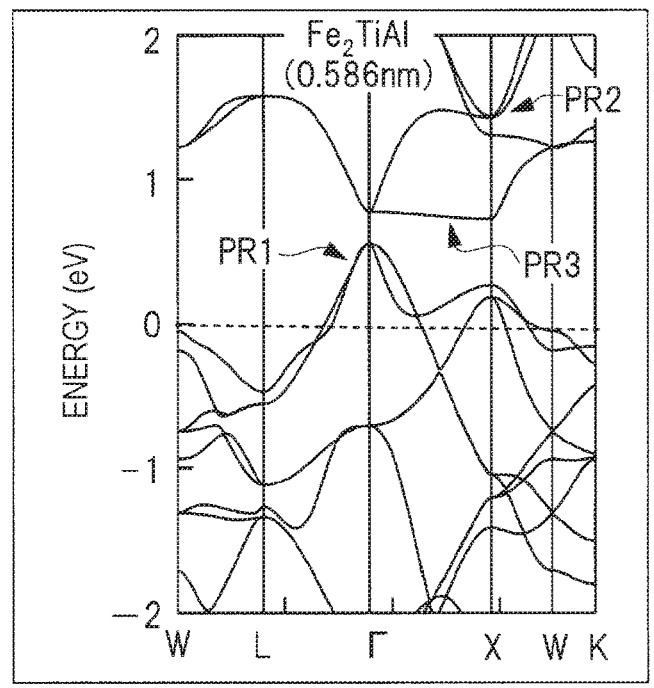
FIG. 3 is a diagram illustrating the band structure of a full Heusler alloy calculated by the first principle calculation.

FIG. 3 is a diagram, illustrating the band structure of a full Heusler alloy calculated by the first principle calculation. FIG. 3 is shows the band structure of a full Heusler alloy represented by the composition formula: Fe$_2$TiAl. In the description given below, the full Heusler alloy represented by the composition formula: Fe$_2$TiAl may be simply referred to as Fe$_2$TiAl.

When a comparison between FIG. 3 and FIG. 1 is made, there exists an energy gap between the conduction band and the valence band in the band structure of a full Heusler alloy represented by the composition formula: Fe$_2$TiAl, unlike the band structure of a full Heusler alloy represented by the composition formula: Fe$_2$VAl. On the other hand, the valence electron concentration, VEC, of a full Heusler alloy represented by the composition formula: Fe$_2$TiAl is 5.75, and since the Fermi level exists within the valence band, the carriers are holes.

Figure 4:
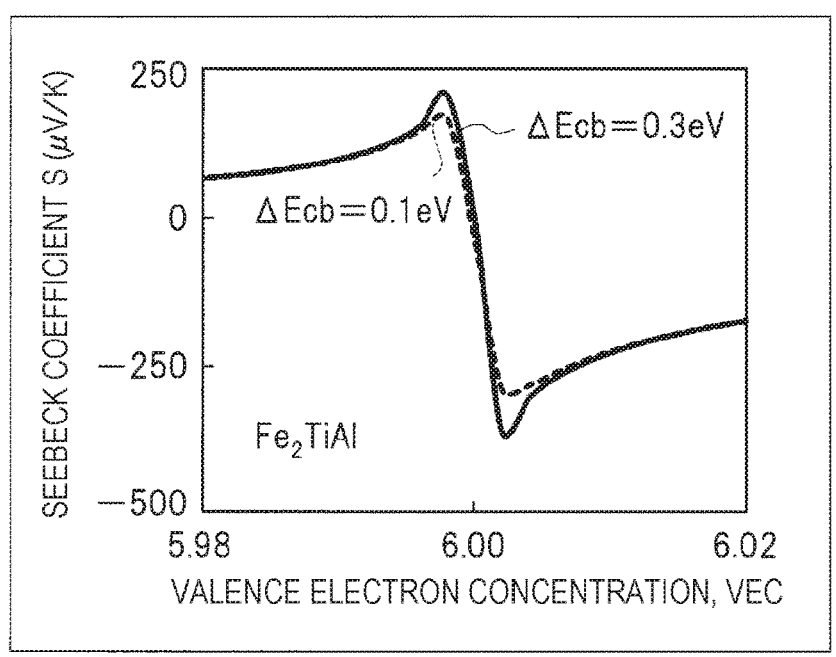
FIG. 4 is a graph showing the dependency of the Seebeck coefficient of a full Heusler alloy obtained by the first principle calculation, on the valence electron concentration.

FIG. 4 is a graph showing the dependency of the Seebeck coefficient of a full Heusler alloy obtained by the first principle calculation, on the valence electron concentration. FIG. 4 shows the Seebeck coefficient of a full Heusler alloy represented by the composition formula: Fe$_2$TiAl. Here, similarly to the example described using FIG. 2, calculation was performed also for the case in which the energy of the conduction band of the full Heusler alloy was artificially shifted to a higher energy level. As shown in FIG. 4, when the shift amount of the energy of the conduction band is designated as ΔEcb, calculation was performed for two occasions of ΔEcb=0.1 eV and ΔEcb=0.3 eV. Therefore, the graph of FIG. 4 shows the dependency of the Seebeck coefficient on the energy gap.

As illustrated in FIG. 3, the full Heusler alloy represented by the composition formula: $Fe_2TiAl$ has an energy gap of about 0.18 eV between the conduction band and the valence band. Therefore, for $Fe_2TiAl$, a Seebeck coefficient S that is larger than that of $Fe_2VAl$ is obtained by adjusting the valence electron concentration, VEC, to be approximately 6. Also for the case of $Fe_2TiAl$, similarly to the case of $Fe_2VAl$, the absolute value of the Seebeck coefficient S increases along with the increase in the energy gap.

As will be described using FIG. 15 that is described below, the valence electron concentration, VEC, satisfies the relation: $5.91 \leq VEC \leq 6.16$. Thereby, the Seebeck coefficient S of the full Heusler alloy having a compound of the composition formula: $Fe_2TiAl$ as a parent material becomes positive, and the full Heusler alloy can be made to function as a p-type thermoelectric conversion material. Also, as will be described using FIG. 15 that is described below, in order to make the Seebeck coefficient S to function sufficiently as a thermoelectric conversion material, it is preferable that the valence electron concentration, VEC, satisfies the relation: $5.91 \leq VEC \leq 6.13$.

Sbstituent Element that Increases Energy Gap

Figure 5:
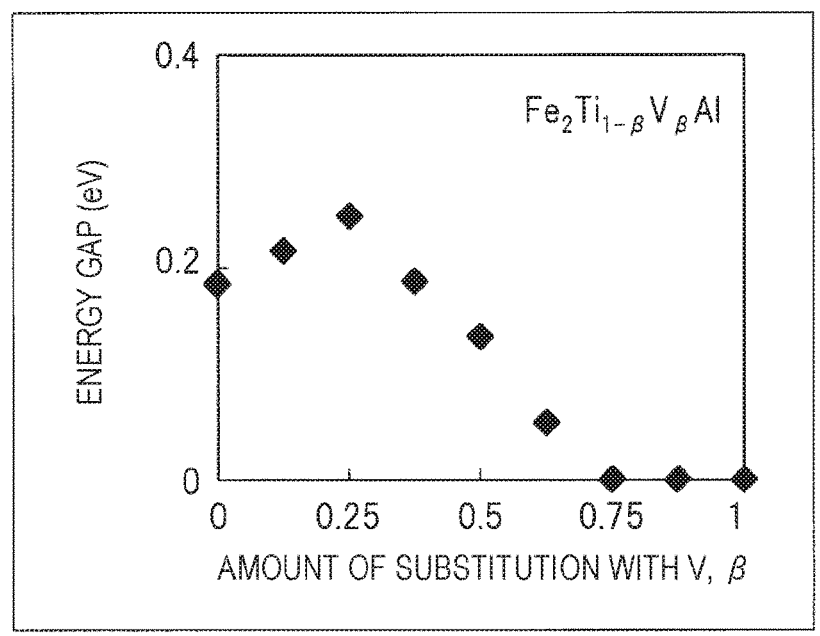
FIG. 5 is a graph showing the dependency of the energy gap between the conduction band and the valence band when a portion of Ti in $Fe_2TiAl$ has been substituted with V, on the amount of substitution.

Next, the substituent element that increases the energy gap of a full Heusler alloy that uses $Fe_2TiAl$ as a parent material will be described. FIG. 5 is a graph showing the dependency of the energy gap between the conduction band and the valence band when a portion of Ti in $Fe_2TiAl$ has been substituted with V, on the amount of substitution.

As illustrated in FIG. 5, the case in which a portion of titanium (Ti), which is a second element that mainly occupies E2 sites, is substituted with vanadium (V), will be considered. In this case, when β (for example, β in the composition formula (Formula 1) described above), which is the amount of substitution with V, is in the range of more than 0 and 0.25 or less, the energy gap between the conduction band and the valence band increases along with an increase in β, and when the amount of substitution with V, β, is 0.25, the energy gap between the conduction band and the valence band becomes the maximum. Meanwhile, when the amount of substitution with V, β, is in the range of more than 0.25 and 0.75 or less, the energy gap between the conduction band and the valence band decreases along with an increase in the amount of substitution with V, β, and when the amount, of substitution with V, β, is 0.75, the energy gap between the conduction band and the valence band becomes zero. Therefore, the energy gap between the conduction band and the valence band exists when the amount of substitution with V, β, satisfies the relation: $0 \leq \beta < 0.75$.

Such a change in the energy gap is described by the change in the band structure of the conduction band in the vicinity of the part PR2 or PR3, which has a flat shape and is also called flat band, in FIG. 1 and FIG. 3.

In a case in which the second element that mainly occupies E2 sites is Ti, the position of the energy level at the band apex of the valence band represented, by the part PR1 is taken as a reference, the position of the energy level of the flat band represented by the part PR3 is lower compared to the case in which the second element is V.

Meanwhile, in a case in which the second element is Ti, the position of the energy level of the downward convex parabolic band shown at the part PR2 is higher compared to the case in which the second element is V. As a result, when a portion of Ti as the second element is substituted with V, the position of the energy level of the part PR3 and the position of the energy level of the part PR2 with respect to the part PR1 change, and thereby, the energy gap increases. Therefore, a high Seebeck coefficient S is obtained by using $Fe_2TiAl$ as a parent material, making the composition ratio 2+α, (for example, 2+α in the composition formula (Formula 1)) of Fe as the first element larger than 2, substituting Ti as the second element with V so as to have a composition ratio of more than 0 and less than 0.75, and adjusting the valence electron concentration, VEC, to be approximately 6.

As illustrated in FIG. 5, suitably, the amount of substitution with V, β, satisfies the relation: $0 \leq \beta \leq 0.625$. At this time, the energy gap between the conduction band and the valence band has a value higher than or equal to 0.05 eV, which is the value of the energy gap at the time of β=0.625, and the energy gap becomes larger. More suitably, the amount of substitution with V, β, satisfies the relation: $0 < \beta < 0.375$. At this time, the energy gap between the conduction band and the valence band has a value higher than 0.18 eV, which is the value of the energy gap at the time of β=0, and the energy gap becomes even larger.

Even in the case in which the amount of substitution with V, β, is more than 0.75, if the amount of substitution with V, β, is 0.90 or less, there is no energy gap; however, the full Heusler alloy exists stably. Thus, although the absolute value of the Seebeck coefficient S is not that high, the full Heusler alloy functions as a thermoelectric conversion material.

Figure 6:
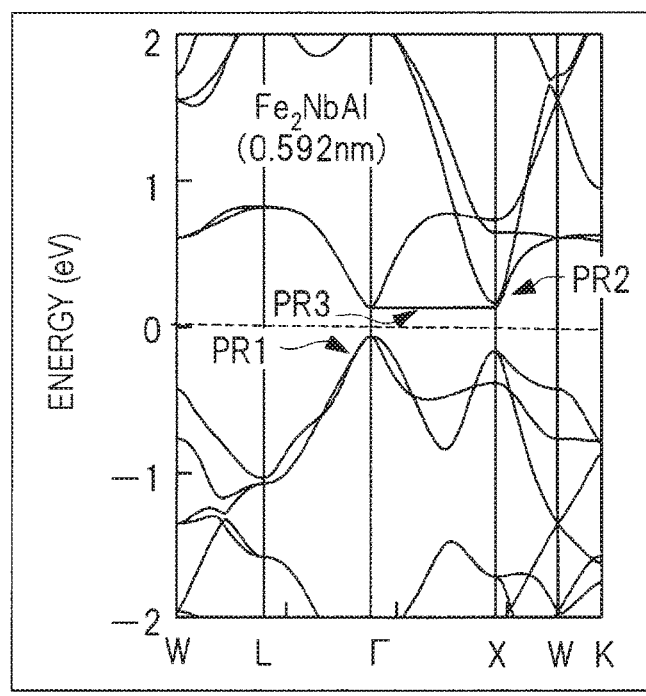
FIG. 6 is a diagram illustrating the band structure of a full Heusler alloy calculated by the first principle calculation.

FIG. 6 is a diagram illustrating the band structure of a full Heusler alloy calculated by the first principle calculation. FIG. 6 illustrates the band structure of a full Heusler alloy represented by the composition formula: $Fe_2NbAl$. In the description given below, the full Heusler alloy represented by the composition formula: $Fe_2NbAl$ may be simply referred to as $Fe_2NbAl$.

When FIG. 6 is compared with FIG. 3, with regard only to the position of the energy level of the downward convex parabolic band represented by the part PR2 when the position of the energy level at the band apex of the valence band represented by the part PR1 is taken as the reference, the band structure of $Fe_2NbAl$ is different from the band structures of $Fe_2TiAl$ and $Fe_2VAl$. However, with regard to the position of the energy level of other portions such as the part PR1 and the part PR3, the band structure of $Fe_2NbAl$ is approximately the same as the band structure of $Fe_2VAl$. In addition, although it is not shown in diagram, the band structure of $Fe_2TaAl$ is approximately the same as the band structure of $Fe_2NbAl$. Therefore, even in the case in which Ti as the second element is substituted with Nb or Ta instead of V, approximately the same effect as that in the case in which the Ti as the second element is substituted with V is expected. That is, a high Seebeck coefficient S is obtained by using $Fe_2TiAl$ as a parent material, making the composition ratio 2+α of Fe as the first element larger than 2, substituting Ti as the second element with a Group 5 element at the amount of substitution that satisfies the relation: $0 \leq \beta < 0.75$, and adjusting the valence electron concentration, VEC, to be approximately 6.

Even in the case in which the energy gap between the conduction band and the valence band is increased as such, the magnitude of the energy gap itself is smaller than the energy gap of a general semiconductor. Therefore, even if the energy gap between the conduction band and the valence band is increased, the specific resistance ρ can be lowered to a value such as, for example, 10 μΩm or less.

The magnitude of this energy gap can be evaluated by a method of directly observing the energy gap by photoelectron spectroscopy, tunneling conductance measurement, or optical conductance measurement; or a method of indirectly observing the energy gap from the temperature dependency of electrical conductance.

Suitable Range of Composition of Thermoelectric Conversion Material

When the dependency of the Seebeck coefficient on the valence electron concentration in a full Heusler alloy, and the substituent element that increases the energy gap are taken into consideration, the suitable range of the composition of the thermoelectric conversion material of the present Embodiment 1 is as follows.

The thermoelectric conversion material of the present Embodiment 1 is such that in $Fe_2TiAl$ as a full Heusler alloy having a $L2_1$ type crystal structure represented by E1$_2$E2E3, a portion of Ti as a second element that occupies E2 sites has been substituted with at least one element selected from the group consisting of V, Nb, and Ta.

At this time, the thermoelectric conversion material of the present Embodiment 1 includes a full Heusler alloy represented by the following composition formula (Formula 4):

$$Fe_{2+\alpha}(T_{1-\beta}M1_\beta)_{1-\alpha+\gamma}Al_{1-\gamma}$$ (Formula 4)

In the composition formula (Formula 4), M1 represents at least one element selected from the group consisting of V, Nb and Ta. α satisfies the relation: 0<α≤0.42, and β satisfies the relation: 0≤β<0.75. Furthermore, the VEC, which is the valence electron concentration per atom, for the full Heusler alloy is a function of α, β, and γ, and is represented by the following mathematical formula (Expression 5). This VEC satisfies the relation: 5.91≤VEC<6.16.

$$VEC(\alpha,\beta,\gamma)=[8\times(2+\alpha)+\{4\times(1-\beta)+5\times\beta\}\times(1-\alpha+\gamma)+3\times(1-\gamma)]/4$$ (Expression 5)

M1 may be at least one element selected from the group consisting of Group 5 elements.

The valence electron concentration, VEC, is determined according to the number of valence electrons of each element and the composition ratio. For example, regarding the valence electron concentration VEC of $Fe_2TiAl$, since the number of valence electrons of Fe is 8, the number of valence electrons of Ti is 4, and the number of valence of Al is 3, the valence electron concentration, VEC, is (8×2+4+3)/4=5.75.

The full Heusler alloy having the above-described composition formula (Formula 4) is such that a portion of Ti, which is a second element that occupies E2 sites in $Fe_2TiAl$ as a full Heusler alloy, has been substituted with at least one element selected from, the group consisting of V, Nb, and Ta. In such a case, the full Heusler alloy exists stably, an energy gap is formed between the conduction band and the valence band, and the full Heusler alloy has a composition that gives a valence electron concentration, VEC, of approximately 6. Thereby, a thermoelectric conversion material that has a high Seebeck coefficient and is inexpensive and capable of reducing environmental burdens is easily obtained.

When the composition ratio 2+α of Fe becomes larger than 2 as α satisfies the relation: α>0, a full Heusler alloy of a single phase can be easily produced. Furthermore, when β satisfies the relation: β>0, that is, when a portion of Ti has been substituted with M1, which is at least one element selected from the group consisting of V, Nb and Ta, the energy gap between the conduction band and the valence band can be increased, as has been described using FIG. 1, FIG. 3, and FIG. 6.

The number of valence electrons of Fe is 8, and this is larger than 5.75, which is the valence electron concentration, VEC, of $Fe_2TiAl$. Furthermore, the number of valence electrons of M1, which is at least one element selected from the group consisting of V, Nb and Ta, is 5, and this is larger than 4, which is the number of valence electrons of Ti. Therefore, as a result of either a satisfying the relation: α>0, or β satisfying the relation: β>0, the valence electron concentration, VEC, of the full Heusler alloy can be increased to be larger than 5.75 and can be made close to 6.

On the other hand, the amount of Al, which is a third element that occupies E3 sites, does not significantly affect the electron state of the vicinity of the Fermi surface. Therefore, the composition ratio 1−γ of Al can be used for the adjustment of the valence electron concentration, VEC.

As such, when the thermoelectric conversion material of the present Embodiment 1 is used, a thermoelectric conversion material that has a high Seebeck coefficient and is inexpensive and capable of reducing environmental burdens is easily obtained. Therefore, when a thermoelectric conversion unit formed from the thermoelectric conversion material of the present Embodiment 1 is mounted in a thermoelectric conversion module, a thermoelectric conversion module that reduces environmental burdens and has high thermoelectric conversion efficiency can be realized.

Alternatively, the thermoelectric conversion material of the present Embodiment 1 may also be a full Heusler alloy represented by the above-described composition formula (Formula 4), in which a portion of Al, which is a third element that occupies E3 sites, has been substituted with at least one element selected from the group consisting of Group 13 elements except for Al, and Group 14 elements, namely, for example, Si.

At this time, the thermoelectric conversion material of the present Embodiment 1 is represented by $Fe_{2+\alpha}(Ti_{1-\beta}M1_\beta)_{1-\alpha+\gamma}(Al_{1-\delta}M2_\delta)_{1-\gamma}$, as shown in the composition formula (Formula 1).

In the composition formula (Formula 1), M1 represents at least one element selected from the group consisting of V, Nb and Ta, and M2 represents at least one element selected from the group consisting of Group 13 elements except for Al, and Group 14 elements. α satisfies the relation: 0<α≤0.42, β satisfies the relation: 0≤β<0.75, and δ satisfies the relation: 0≤δ<0.5.

Here, the number of valence electrons of M1 is designated as m1, and the number of valence electrons of M2 is designated as m2. At this time, the VEC, the valence electron concentration per atom, for a full Heusler alloy represented by the above-described composition formula (Formula 1) is represented by the mathematical formula (Expression 1) as a function of α, β, γ, and δ. Also, the valence electron concentration, VEC, satisfies the relation: 5.91≤VEC<6.16.

As will be described using FIG. 15 that is described below, in a case in which a portion of Al, which is a third element that occupies E3 sites, has been substituted with at least one element selected from, the group consisting of Group 13 elements except for Al and Group 14 elements, for example, Si or the like, the valence electron concentration, VEC, changes significantly, and the Seebeck coefficient. S does not change noticeably. This implies that in order to increase the Seebeck coefficient S, not only it is necessary to adjust the valence electron concentration, VEC, but it is also necessary to substitute a portion of Ti existing at E2 sites with a Group 5 element. The number of valence electrons of Group 14 elements is 4, and the number of valence electrons of Group 13 elements is larger than 3. Therefore, by substituting a portion of Al, which is a third element that occupies E3 sites, with a Group 14 element, the valence electron concentration, VEC, of the full Heusler alloy can be freely adjusted, while the full Heusler alloy structure is allowed to exist stably. Furthermore, although it is not shown in the diagram, it is known that the energy gap changes with the type of the element of the E3 site in a full Heusler alloy. For example, Al is substituted with Ga, which is a heavier element, the energy gap is reduced. However, on the other hand, the thermal conductivity κ decreases. Therefore, the magnitude of the energy gap can be freely adjusted by substituting Al, which is the third element that occupies E3 sites, with at least one element selected from the group consisting of Group 13 elements except for Al and Group 14 elements, and thus the Seebeck coefficient S can be adjusted. Also, the thermal conductivity κ can also be decreased by substituting Al with an element that is heavier than Al.

In regard to the amount of substitution δ, which is the proportion to be substituted of Al as the third element that occupies E3 sites, since the full Heusler alloy represented by the composition formula (Formula 1) contains Al as a main component of the third element in order to stabilize the full Heusler alloy structure, δ satisfies the relation: 0≤δ<0.5.

Alternatively, the thermoelectric conversion material of the present Embodiment 1 may also be a full Heusler alloy represented by the above-described composition formula (Formula 4), in which a portion of Fe as the first element that occupies E1 sites has been substituted with at least one element selected from, the group consisting of Group 7 elements, Group 8 elements except for Fe, and Group 9 elements, namely, for example, Mn or Co.

At this time, the thermoelectric conversion material of the present Embodiment 1 is represented by $(Fe_{1-x}K1_x)_{2+\alpha}(Ti_{1-\beta}M1_\beta)_{1-\alpha+\gamma}Al_{1-\gamma}$, as represented by the composition formula (Formula 2).

In the composition formula (Formula 2), K1 represents at least one element selected from the group consisting of Group 7 elements, Group 8 elements except for Fe and Group 9 elements, and M1 represents at least one element selected from the group consisting of V, Mb and Ta, x satisfies the relation: 0<x<0.5, α satisfies the relation: 0<α≤0.42, and β satisfies the relation: 0≤β<0.75.

Here, the number of valence electrons of K1 is designated as k1, and the number of valence electrons of M1 is designated as m1. At this time, the VEC, which is the valence electron concentration per atom, for the full Heusler alloy represented by the composition formula (Formula 2) is represented by the mathematical formula (Expression 2) as a function of x, α, β, and γ. Also, the valence electrons concentration, VEC, satisfies the relation: 5.91≤VEC<6.16.

As will be described using FIG. 15 that will be described below, even in a case in which a portion of Fe, which is the first element that occupies E1 sites, has been substituted with at least one element selected from the group consisting of Group 7 elements, Group 8 elements except for Fe, and Group 9 elements, namely, for example, Mn or Co, the Seebeck coefficient S does not change noticeably. This implies that in order to increase the Seebeck coefficient S, not only it is necessary to adjust the valence electron concentration, VEC, but it is also necessary to substitute a portion of Ti existing in E2 sites with Group 5 elements. The number of valence electrons of Group 7 elements is 7, the number of valence electrons of Group 8 elements is 8, and the number of valence electrons of Group 9 elements is 9. Therefore, the magnitude of the energy gap or the valence electron concentration, VEC, can be freely adjusted, while the full Heusler alloy is allowed to exist stably. Also, the thermal conductivity κ can also be decreased by substituting Fe with an element that is heavier than Fe.

In regard to the amount of substitution x, which is the proportion to be substituted of Fe as the first element that occupies E1 sites, since the full Heusler alloy represented by the composition formula (Formula 2) contains Fe as a main component of the first element in order to stabilize the full Heusler alloy structure, x satisfies the relation: 0<x<0.5.

Alternatively, the thermoelectric conversion material of the present Embodiment 1 may also be a full Heusler alloy represented by the above-described composition formula (Formula 4), in which a portion of Ti as the second element that occupies E2 sites has been substituted with V, Nb or Ta, as well as at least one element selected from the group consisting of Group 4 elements, Group 6 elements, and Group 7 elements, namely, for example, Mn.

At this time, the thermoelectric conversion material of the present Embodiment 1 is represented by $Fe_{2+\alpha}((Ti_{1-y}K2_y)_{1-\beta}M1_\beta)_{1-\alpha+\gamma}Al_{1-\gamma}$, as represented by the composition formula (Formula 3).

In the composition formula (Formula 3), K2 represents at least one element selected from the group consisting of Group 4 elements except for Ti, Group 6 elements, and Group 7 elements, and M1 represents at least one element selected from the group consisting of V, Nb and Ta. y satisfies the relation: 0<y<0.5, α satisfies the relation: 0<α≤0.42, and β satisfies the relation: 0≤β<0.75.

Here, the number of valence electrons of K2 is designated as k2, and the number of valence electrons of M1 is designated as m1. At this time, the VEC, which is the valence electron concentration per atom, for the full Heusler alloy is represented by the mathematical formula (Expression 3) as a function of y, α, β, and γ. Also, the valence electron concentration, VEC, satisfies the relation: 5.91≤VEC<6.16.

As will be described using FIG. 15 that is described below, even in a case in which a portion of Ti has been substituted with at least one element selected from the group consisting of Group 4 elements except for Ti, Group 6 elements, and Group 7 elements, namely, for example, Mn, the Seebeck coefficient S does not change noticeably. This implies that in order to increase the Seebeck coefficient S, not only it is necessary to adjust the valence electron concentration, VEC, but it is also necessary to substitute a portion of Ti existing at E2 sites with a Group 5 element. The number of valence electrons of Group 4 elements is 4, the number of valence electrons of Group 6 elements is 6, and the number of valence electrons of Group 7 elements is 7. Therefore, the magnitude of the energy gap or the valence electron concentration, VEC, can be freely adjusted, while the full Heusler alloy is allowed to exist stably. Furthermore, the thermal conductivity κ can also be decreased by substituting Ti with an element that is a heavier element than Ti.

Within the portion that is not substituted with M1 in the part of Ti as the second element occupying E2 sites, with regard to y, which is the proportion that is substituted with K2, since the full Heusler alloy represented by the composition formula (Formula 3) contains Ti as a main component of the portion that is not substituted with M1 in the part of Ti as the second element in order to stabilize the full Heusler alloy structure, y satisfies the relation: 0<y<0.5.

For all of the composition formula (Formula 1), the composition formula (Formula 2), the composition formula (Formula 3), and the composition formula (Formula 4), $\beta$ satisfies the relation: $0 \le \beta < 0.75$. At this time, as described above using FIG. 5, there exists an energy gap between the conduction band and the valence band.

Suitably, $\beta$ satisfies the relation: $0 \le \beta \le 0.625$. At this time, as described above using FIG. 5, the energy gap between the conduction band and the valence band is further increased. More suitably, $\beta$ satisfies the relation: $0 < \beta < 0.375$. At this time, as described above using FIG. 5, the energy gap between the conduction band and the valence band is further increased.

Thermoelectric Conversion Module

Figure 7:
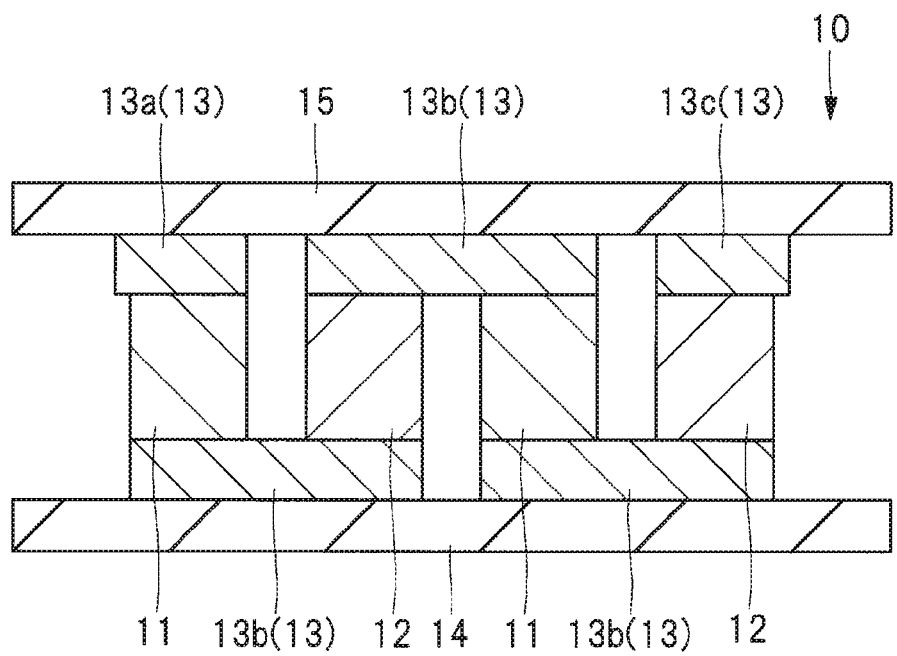
FIG. 7 is a cross-sectional view illustrating the configuration of a thermoelectric conversion module of Embodiment 1.

Next, the thermoelectric conversion module of the present Embodiment 1 will be described. FIG. 7 is a cross-sectional view illustrating the configuration of a thermoelectric conversion module of Embodiment 1.

The thermoelectric conversion module 10 includes a p-type thermoelectric conversion unit 11; an n-type thermoelectric conversion unit 12; a plurality of electrodes 13; a lower substrate 14; and an upper substrate 15. Furthermore, the thermoelectric conversion module 10 has an electrode 13a, an electrode 13b, and an electrode 13c as the plurality of electrodes 13.

The p-type thermoelectric conversion unit 11 and the n-type thermoelectric conversion unit 12 are alternately arrayed between the electrode 13a and the electrode 13c, which are voltage extraction units, with the electrodes 13b interposed therebetween, and the thermoelectric conversion units are electrically connected in series. The p-type thermoelectric conversion unit 11 and the n-type thermoelectric conversion unit 12 are provided between the lower substrate 14 and the upper substrate 15 that are arranged to face each other. For example, a plurality of electrodes 13b that electrically connects between a p-type thermoelectric conversion unit 11 and an n-type thermoelectric conversion unit 12, which are adjacent to each other, are alternately thermally contacted with the lower substrate 14 or the upper substrate 15.

For example, the end on the lower substrate 14 side of the first p-type thermoelectric conversion unit 11 in the array and the end on the lower substrate 14 side of the second n-type thermoelectric conversion unit 12 in the array are electrically connected by the electrodes 13b that are thermally contacted with the lower substrate 14, Thereby, the first p-type thermoelectric conversion unit 11 in the array and the second n-type thermoelectric conversion unit 12 in the array are electrically connected in series. Also, the end on the upper substrate 15 side of the second n-type thermoelectric conversion unit 12 in the array and the end on the upper substrate 15 side of the third p-type thermoelectric conversion unit 11 in the array are electrically connected by the electrodes 13b that are thermally contacted with the upper substrate 15. Thereby, the second n-type thermoelectric conversion unit 12 in the array and the third p-type thermoelectric conversion unit 11 in the array are electrically connected in series.

In the present Embodiment 1, when the thermoelectric conversion module 10 generates electricity, a temperature difference is provided between the temperature of the lower substrate 14 and the temperature of the upper substrate 15, and thereby thermoelectromotive force is generated at the p-type thermoelectric conversion unit 11 and the n-type thermoelectric conversion unit 12 as a result of the Seebeck effect. Thus, electric power can be obtained through the electrode 13a and the electrode 13c. Also, since the thermoelectromotive force generated at the p-type thermoelectric conversion unit 11 and the thermoelectromotive force generated at the n-type thermoelectric conversion unit 12 do not cancel each other but add up, greater electric power can be obtained through the electrode 13a and the electrode 13c.

In the present Embodiment 1, a sintered body that is produced by sintering a mixed powder obtained by mixing powders of various elements, for example, by a hot pressing method, can be used as a thermoelectric conversion material to be included respectively in the p-type thermoelectric conversion unit 11 and the n-type thermoelectric conversion unit 12, Here, the sintering temperature for the sintered body according to the hot pressing method is, for example, 800° C., and the sintering time is, for example, 5,000 seconds. In order to enhance the degree of order, that is, the crystallinity of the sintered body, the sintering temperature may be set to be higher than 800° C., or the sintering time may be set to be longer than 5,000 seconds.

Alternatively, a sintered body that is produced by micronizing a mixed powder obtained by mixing powders of various elements by, for example, a mechanical alloying method, and then sintering the mixed powder by, for example, a spark plasma method, can also be used as the thermoelectric conversion material to be included in any of the p-type thermoelectric conversion unit 11 and the n-type thermoelectric conversion unit 12. Here, the sintering temperature of the sintered body according to the spark plasma method is, for example, 800° C., and the sintering temperature is, for example, 60 seconds. The average particle size of the crystallites included in the sintered body can be decreased to 1 μm or less by such a method, and the thermal conductivity κ can be decreased.

In the present Embodiment 1, the thermoelectric conversion material of the present Embodiment 1 can be used as the thermoelectric conversion material that is included in any of the p-type thermoelectric conversion unit 11 and the n-type thermoelectric conversion unit 12. As described above, the thermoelectric conversion material of the present Embodiment 1 is a material in which a portion of Ti, which is a second element that occupies E2 sites, in $Fe_2TiAl$ as a full Heusler alloy has been substituted with at least one element selected from the group consisting of V, Nb and Ta. In such a case, the full Heusler alloy exists stably, an energy gap is formed between the conduction band and the valence band, and the full Heusler alloy has a composition with a valence electron concentration, VEC, of approximately 6. Thereby, a thermoelectric conversion material that has a high Seebeck coefficient and is inexpensive and capable of reducing environmental burdens can be easily obtained. Therefore, a thermoelectric conversion module having high thermoelectric conversion efficiency and less environmental burden can be provided.

In the present Embodiment 1, the composition of the full Heusler alloy is adjusted so as to obtain a higher Seebeck coefficient S. Therefore, the production method is not limited to the production method described above, and the full Heusler alloy can also be produced using a general production method that is used for forming an alloy, for example, a casting method such as arc melting.

As the material of the electrodes 13, for example, Ni (nickel) can be used. As the lower substrate 14 and the upper substrate 15, for example, AlN can be used.

As the material of the electrodes 13, a metal that has excellent adhesiveness to the p-type thermoelectric conversion unit 11, the n-type thermoelectric conversion unit 12, the lower substrate 14 or the upper substrate 15, and has a small thermal stress difference between the electrode and the p-type thermoelectric conversion unit 11, the n-type thermoelectric conversion unit 12, the lower substrate 14 or the upper substrate 15, may also be used. Examples of such a material include Al, and a full Heusler alloy as a simple metal in a case in which the valence electron concentration, VEC, is far from 6.

Embodiment 2

In Embodiment 1, an example in which the thermoelectric conversion module has thermoelectric conversion units of both types of the p-type thermoelectric conversion unit and the n-type thermoelectric conversion unit has been described. On the other hand, in Embodiment 2, an example in which the thermoelectric conversion module has only any one type of the p-type thermoelectric conversion unit and the n-type thermoelectric conversion unit will be described.

Figure 8:
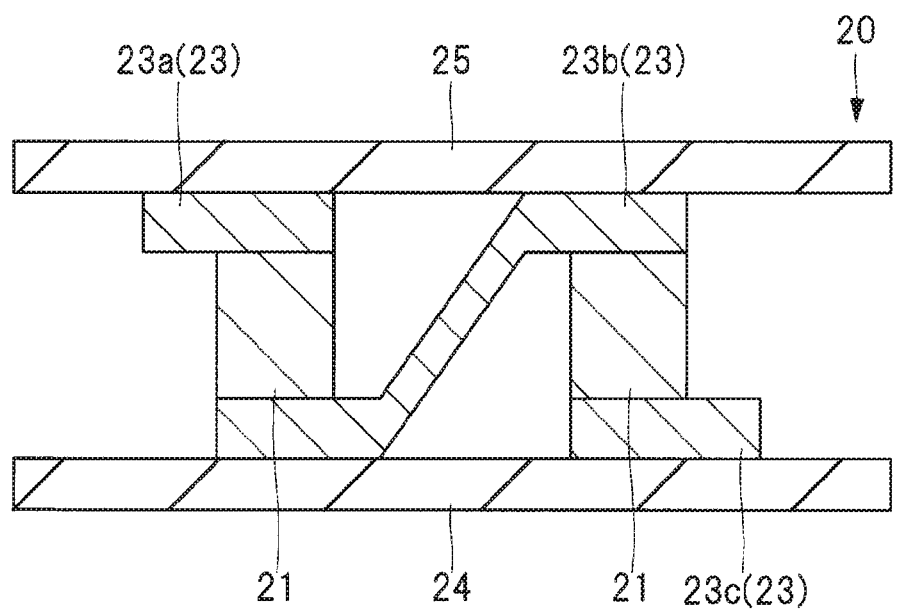
FIG. 8 is a cross-sectional view illustrating the configuration of a thermoelectric conversion module of Embodiment 2.

FIG. 8 is a cross-sectional view illustrating the configuration of a thermoelectric conversion module of Embodiment 2.

The thermoelectric conversion module 20 has a thermoelectric conversion unit 21, a plurality of electrodes 23, a lower substrate 24, and an upper substrate 25. Furthermore, the thermoelectric conversion module 20 has an electrode 23a, an electrode 23b, and an electrode 23c as the plurality of electrodes 23.

The thermoelectric conversion unit 21 is formed from a p-type or n-type thermoelectric conversion material. Even in a case in which the thermoelectric conversion module 20 has a plurality of thermoelectric conversion units 21, it can be configured such that each of the plurality of thermoelectric conversion units 21 is formed from any one of the p-type or n-type thermoelectric conversion material. That is, in the present Embodiment 2, the thermoelectric conversion unit 21 is any one of the p-type thermoelectric conversion unit 11 and the n-type thermoelectric conversion unit 12 of Embodiment 1, and is a so-called unileg type thermoelectric conversion unit.

The plurality of thermoelectric conversion units 21 is arrayed between the electrode 23a and the electrode 23c, which are voltage extraction units, with the electrode 23b being interposed therebetween, and the thermoelectric conversion units are electrically connected in series. The plurality of thermoelectric conversion units 21 is provided between the lower substrate 24 and the upper substrate 25 that are arranged to face each other. For example, in the plurality of electrodes 23b that electrically connects between adjacent two thermoelectric conversion units 21, the end on one side is thermally contacted with the lower substrate 24, and the end on the other end is thermally contacted with the upper substrate 25.

For example, the end on the lower substrate 24 side of the first thermoelectric conversion unit 21 in the array and the end on the upper substrate 25 side of the second thermoelectric conversion unit 21 in the array are electrically connected by an electrode 23b. Thereby, the first thermoelectric conversion unit 21 in the array and the second thermoelectric conversion unit 21 in the array are electrically connected in series.

In the present Embodiment 2, when the thermoelectric conversion module 20 generates electricity, a temperature difference is provided between the temperature of the lower substrate 24 and the temperature of the upper substrate 25, and thereby thermoelectromotive force is generated at each of the thermoelectric conversion units 21 as a result of the Seebeck effect. Thus, electric power can be obtained through the electrode 23a and the electrode 23c. Also, since the thermoelectromotive forces generated at the various thermoelectric conversion units 21 do not cancel each other but add up, greater electric power can be obtained through the electrode 23a and the electrode 23c.

In the present Embodiment 2, the respective materials for the electrodes 13, the lower substrate 14, and the upper substrate 15 used in Embodiment 1 can be used as the respective materials for the electrodes 23, the lower substrate 24, and the upper substrate 25.

In the present Embodiment 2, the thermoelectric conversion material of Embodiment 1 can be used as the thermoelectric conversion material included in the thermoelectric conversion unit 21. Thereby, a thermoelectric conversion material that has a high Seebeck coefficient and is inexpensive and capable of reducing environmental burdens is easily obtained. Therefore, a thermoelectric conversion module having high thermoelectric conversion efficiency and less environmental burden can be provided, similarly to Embodiment 1.

Also in the present Embodiment 2, similarly to Embodiment 1, a sintered body that is produced by sintering a mixed powder obtained by mixing powders of various elements by, for example, a not pressing method, can be used as the thermoelectric conversion material to be included in the thermoelectric conversion unit 21. Alternatively, also in the present Embodiment 2, similarly to Embodiment 1, a sintered body that is produced by micronizing a mixed powder obtained by mixing powders of various elements by, for example, a mechanical alloying method, and then sintering the mixed powder by a hot pressing method, can be used as the thermoelectric conversion material to be included in the thermoelectric conversion unit 21.

Embodiment 3

In Embodiment 1, an example in which the p-type thermoelectric conversion unit and the n-type thermoelectric conversion unit are formed from a sintered body has been described. On the other hand, in Embodiment 3, an example in which the p-type thermoelectric conversion unit and the n-type thermoelectric conversion unit are formed from thin films will be described.

Figure 9:
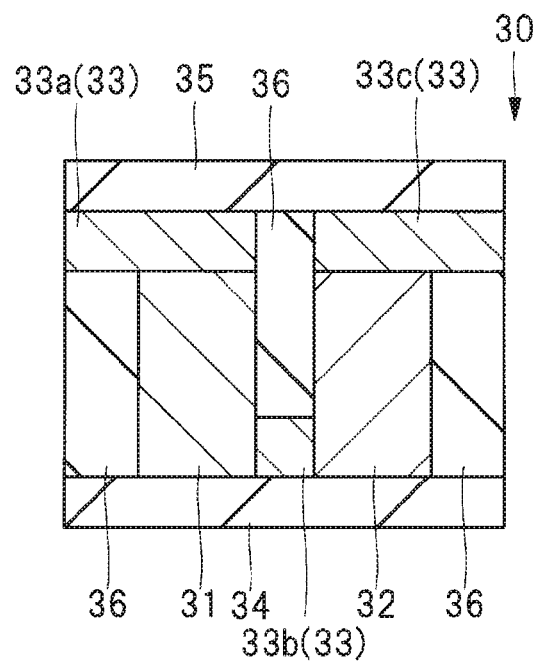
FIG. 9 is a cross-sectional view illustrating the configuration of a thermoelectric conversion module of Embodiment 3.

FIG. 9 is a cross-sectional view illustrating the configuration of a thermoelectric conversion module of Embodiment 3.

The thermoelectric conversion module 30 has a p-type thermoelectric conversion unit 31, an n-type thermoelectric conversion unit 32, a plurality of electrodes 33, a lower substrate 34, an upper substrate 35, and an interlayer insulating film 36. Furthermore, the thermoelectric conversion module 30 has an electrode 33a, an electrode 33b, and an electrode 33c as the plurality of electrodes 33.

The p-type thermoelectric conversion unit 31 and the n-type thermoelectric conversion unit 32 are alternately arrayed between the electrode 33a and the electrode 33c, which are voltage extraction units, with the electrode 33b being interposed therebetween, and the thermoelectric conversion units are electrically connected in series. The p-type thermoelectric conversion unit 31 and the n-type thermoelectric conversion unit 32 are provided between the lower substrate 34 and the upper substrate 35 that are arranged to face each other. For example, a plurality of electrodes 33b that, electrically connects between a p-type thermoelectric conversion unit 31 and an n-type thermoelectric conversion unit 32, which are adjacent to each other, are alternately thermally contacted with the lower substrate 34 or the upper substrate 35.

For example, the end on the lower substrate 34 side of the first p-type thermoelectric conversion unit 31 in the array and the end on the lower substrate 34 side of the second n-type thermoelectric conversion unit 32 in the array are electrically connected by an electrode 33b. Thereby, the first p-type thermoelectric conversion unit 31 in the array and the second n-type thermoelectric conversion unit 32 in the array are electrically connected in series.

In the present Embodiment 3, when the thermoelectric conversion module 30 generates electricity, a temperature difference is provided between the temperature of the lower substrate 34 and the temperature of the upper substrate 35, and thereby thermoelectromotive force is generated at the p-type thermoelectric conversion unit 31 and the n-type thermoelectric conversion unit 32 as a result of the Seebeck effect. Thus, electric power can be obtained through the electrode 33a and the electrode 33c. That is, when the thermoelectric conversion module 30 generates electricity, a temperature difference is provided between the temperature of the upper surface and the temperature of the lower surface of a thin film that is included in each of the p-type thermoelectric conversion unit 31 and the n-type thermoelectric conversion unit 32. Also, since the thermoelectromotive force generated at the p-type thermoelectric conversion unit 31 and the thermoelectromotive force generated at the n-type thermoelectric conversion unit 32 do not cancel each other but add up, greater electric power can be obtained through the electrode 33a and the electrode 33c.

As the material for the electrodes 33, for example, Ni can be used, and as the material for the upper substrate 35, for example, AlN can be used. The electrodes 33 may be formed using any material as long as the material can electrically connect the p-type thermoelectric conversion unit 31 and the n-type thermoelectric conversion unit 32, and as the material for the electrodes 33, Cu (copper), Ag (silver), Au (gold), or Pt (platinum), all of which have high electrical conductivity, can also be used instead of Ni.

In the present Embodiment 3, the thermoelectric conversion material of Embodiment 1 can be used as the thermoelectric conversion material that is included in both of the p-type thermoelectric conversion unit 31 and the n-type thermoelectric conversion unit 32. Thereby, a thermoelectric conversion material that has a high Seebeck coefficient and is inexpensive and capable of reducing environmental burdens is easily obtained, and similarly to Embodiment 1, a thermoelectric conversion module having high thermoelectric conversion efficiency and less environmental burden can be provided.

On the other hand, in the present Embodiment 3, unlike Embodiment 1, a thin film can be used as the thermoelectric conversion material that is included in any of the p-type thermoelectric conversion unit 31 and the n-type thermoelectric conversion unit 32. Regarding the method of forming the thin film, for example, a sputtering method can be used. The method of forming the thin film is not limited to the sputtering method, and for example, a molecular beam epitaxy (MBE) method, a pulsed laser deposition (PLD) method, a chemical vapor deposition (CVD) method, or the like can be used.

In the present Embodiment 3, it is desirable that the lower substrate 34 is a substrate suitable for growing a thin film formed from a full Heusler alloy, and as the lower substrate 34, for example, a single crystal substrate formed from MgO, that is, a single crystal MgO substrate can be used.

Alternatively, as the lower substrate 34, a single crystal substrate formed from $MgAl_2O_4$ that can easily undergo lattice matching with a full Heusler alloy, that is, a single crystal $MgAl_2O_4$ substrate can also be used.

For example, on a lower substrate 34 formed from, a single crystal MgO substrate, a thin film in an amorphous state is formed at normal temperature, and then the thin film is subjected to a heat treatment. Thereby, a thin film having the crystal structure of a full Heusler alloy can be formed. Alternatively, a thin film having the crystal structure of a full Heusler alloy may also be formed at the time of film-forming, by forming a film at a high temperature such as, for example, 200° C. or higher.

Here, an example in which a thin film formed from a full Heusler alloy was formed as the p-type thermoelectric conversion material to be included in the p-type thermoelectric conversion unit 31, on a single crystal MgO substrate using a magnetron sputtering method as the sputtering method, will be referred to as Example 1 and will be described below. The thin film formed in Example 1 was formed on a single crystal MgO substrate, and the film thickness was 200 nm. In Example 1, a thin film having the crystal structure of a full Heusler alloy was formed by forming, at normal temperature, a thin film in an amorphous state, and subjecting the thin film to a heat treatment at 800° C.

In the present Embodiment 1, a film was formed using a full Heusler alloy represented by the composition formula: $Fe_2TiAl$ as a sputtering target. The composition of the thin film thus formed was analyzed by ICP emission spectrometry, and as a result, the composition of the thin film thus formed was $Fe_{2.18}Ti_{0.73}Al_{1.09}$, while the valence electron concentration, VEC, was 5.93.

First, the crystal structure of the thin film formed in the present Example 1 will be described. Herein, the crystal structure of the thin film thus formed was evaluated by an X-ray diffraction (XRD) method and transmission electron microscopy.

Figure 10:
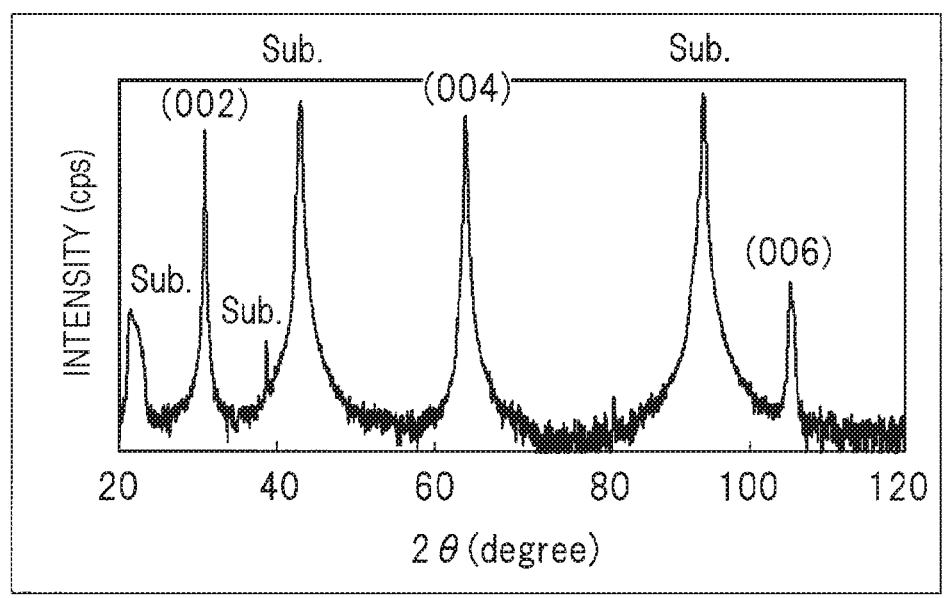
FIG. 10 is a graph showing a $\theta$-$2\theta$ spectrum of a thin film formed as measured according to an XRD method.

FIG. 10 is a graph showing a θ-2θ spectrum of a thin film formed as measured according to an XRD method. In the spectrum shown in FIG. 10, the peaks indicated with "Sub." are peaks corresponding to the single crystal MgO substrate. In the spectrum shown in FIG. 10, when the peaks corresponding to the single crystal MgO substrate are excluded, only the peaks corresponding to the (002) plane, (004) plane, and (006) plane of the full Heusler alloy are observed, and it is understood that a thin film formed from a single phase full Heusler alloy has been formed.

Figure 11:
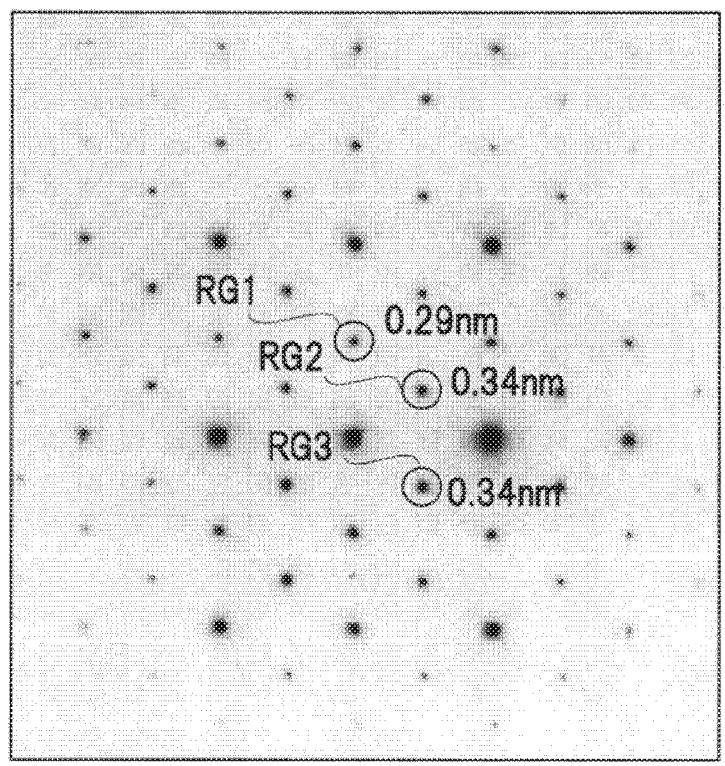
FIG. 11 is an electron beam diffraction image of the thin film formed.

FIG. 11 is an electron beam diffraction image of the thin film formed. In an electron beam diffraction image observed as shown in FIG. 11, the diffraction spots observed respectively in Region RG1, Region RG2, and Region RG3 correspond to crystal planes having a spacing of 0.29 nm, 0.34 nm, and 0.34 nm, respectively. Therefore, in the thin film thus formed, a crystal structure having symmetry identical to the symmetry of a full Heusler alloy is observed. On the other hand, in the electron beam diffraction image thus observed, a crystal structure having symmetry other than the symmetry shown by a full Heusler alloy is not observed. Therefore, it was found also from the observation of a diffraction image in micro-regions by transmission electron microscopy that a thin film formed from a single phase full Heusler alloy had been formed.

Furthermore, the average composition in the entire thin film obtained by the ICP emission spectrometry described above coincided with local compositions of the thin film obtained by EDX. From the above results, the composition ratio of Fe, 2+α, becomes 2.18 and is larger than 2. Thereby, the crystal structure of the full Heusler alloy was stabilized compared to other crystal structures, and therefore, it is contemplated that a thin film formed from, a single phase full Heusler alloy was formed.

Next, the thermoelectric conversion characteristics of the thin film formed in the present Example 1 will be described. The Seebeck coefficient S and specific resistance ρ of the thin film thus formed were evaluated by a two-terminal method and a 4-terminal method, respectively, and the Seebeck coefficient S was 45 μV/K, while the specific resistance ρ was 2.3μΩ. Since the valence electron concentration, VEC, was smaller than 6, the material was p-type, that is, holes served as carriers. Thus, despite that the specific resistance was low and the electron state was close to the metallic state, a high Seebeck coefficient S was obtained.

Furthermore, the thermal conductivity κ in the film thickness direction of the thin film thus formed was evaluated by a thermal reflectance method, and the thermal conductivity κ was 7.2 W/Km. This was about ⅓ of the thermal conductivity of a sintered body formed from, a full Heusler alloy represented by the composition formula: $Fe_2VAl$. This is speculated to be because the film thickness of the thin film was about 200 nm, which was to the same extent as the phonon mean free path, and the lattice thermal conductivity was lowered.

Thus, the p-type thermoelectric conversion material that is included in the p-type thermoelectric conversion unit 31 has been described. Similarly, as the thermoelectric conversion material that is included in the n-type thermoelectric conversion unit 32, an n-type thermoelectric conversion material obtainable by substituting any element of the first element, the second element, and the third element in the p-type thermoelectric conversion material, that is included in the p-type thermoelectric conversion unit 31, and thereby appropriately increasing the valence electron concentration, VEC, can be used.

It is desirable that the interlayer insulating film 36 can prevent electrical contact between the p-type thermoelectric conversion unit 31 and the n-type thermoelectric conversion unit 32 without having the electrode 33 interposed therebetween. Therefore, as the material for the interlayer insulating film 36, for example, a material having superior insulating properties, such as AlO, can be used.

Embodiment 4

In Embodiment 3, an example in which the p-type thermoelectric conversion unit and the n-type thermoelectric conversion unit are formed from thin films, and when the thermoelectric conversion module generates electricity, a temperature difference is provided between the temperature of the upper surface and the temperature of the lower surface of the thin films that are respectively included in the p-type thermoelectric conversion unit and the n-type thermoelectric conversion unit, has been described. On the other hand, in Embodiment 4, an example in which the p-type thermoelectric conversion unit and the n-type thermoelectric conversion unit are formed from thin films; however, when the thermoelectric conversion module generates electricity, a temperature difference is provided between the temperature of one end and the temperature of the other end in the direction in a certain direction within the upper surface of the thin film that is included in the p-type thermoelectric conversion unit or the n-type thermoelectric conversion unit, will be described.

Figure 12:
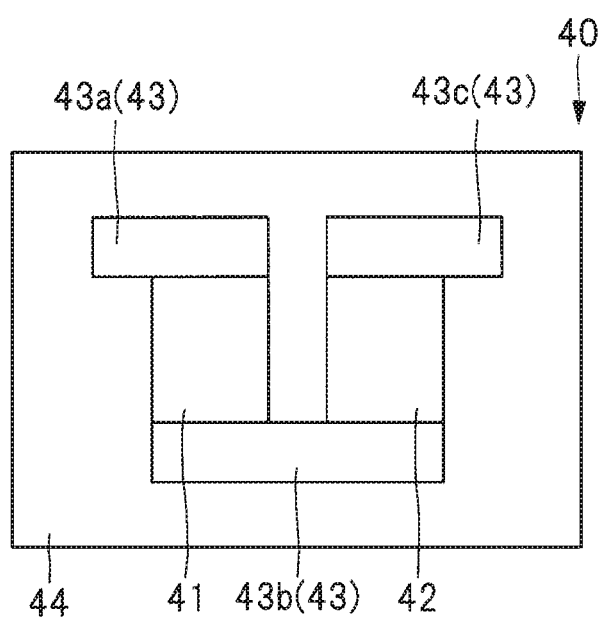
FIG. 12 is a top view illustrating the configuration of a thermoelectric conversion module of Embodiment 4.

FIG. 12 is a top view diagram illustrating a configuration of a thermoelectric conversion module of Embodiment 4.

The thermoelectric conversion module 40 has a p-type thermoelectric conversion unit 41, an n-type thermoelectric conversion unit 42, a plurality of electrodes 43, and a substrate 44. The thermoelectric conversion module 40 has an electrode 43a, an electrode 43b, and an electrode 43c as the plurality of electrodes 43.

The p-type thermoelectric conversion unit 41 and the n-type thermoelectric conversion unit 42 are alternately arrayed between the electrode 43a and the electrode 43c, which are voltage extraction units, with the electrode 43b being interposed therebetween, and the thermoelectric conversion units are electrically connected in series. The p-type thermoelectric conversion unit 41 and the n-type thermoelectric conversion unit 42 are formed on the substrate 44, Here, two directions that intersect each other, suitably orthogonally intersect, within the top surface of the substrate 44 are designated as the X-axis direction and the Y-axis direction. At this time, for example, a plurality of electrodes 43b that electrically connects between the p-type thermoelectric conversion unit 41 and the n-type thermoelectric conversion unit 42, which are adjacent to each other, is alternately thermally contacted with one end and the other end in the Y-axis direction of the substrate 44.

For example, the end on the negative side in the Y-axis direction of the first p-type thermoelectric conversion unit 41 in the array and the end on the negative side in the Y-axis direction of the second n-type thermoelectric conversion unit 42 in the array are electrically connected by the electrode 43b. Thereby, the first p-type thermoelectric conversion unit 41 in the array and the second n-type thermoelectric conversion unit 42 in the array are electrically connected in series.

In the present Embodiment 4, when the thermoelectric conversion module 40 generates electricity, a temperature difference is provided between the temperature of the end on the positive side and the temperature of the end on the negative side with respect to the Y-axis direction of the thermoelectric conversion module 40 in the Y-axis direction. That is, in the present Embodiment 4, a temperature difference is provided in the in-plane direction of the thin film formed from a thermoelectric conversion material.

Also in the present Embodiment 4, similarly to Embodiment 3, for example, Ni, Cu, Ag, Au or Pt can be used as the material for the electrode 43.

In the present Embodiment 4, the thermoelectric conversion material of Embodiment 1 can be used as the thermoelectric conversion material to be included in the p-type thermoelectric conversion unit 41 and the n-type thermoelectric conversion unit 42. Thereby, a thermoelectric conversion material that has a high Seebeck coefficient and is inexpensive and capable of reducing environmental burdens is easily obtained. Accordingly, similarly to Embodiment 1, a thermoelectric conversion module having high thermoelectric conversion efficiency and less environmental burden can be provided.

Also in the present Embodiment 4, similarly to Embodiment 3, a thin film can be used as the thermoelectric conversion material to be included in the p-type thermoelectric conversion unit 41 and the n-type thermoelectric conversion unit 42. Regarding the method for forming a thin film, for example, a sputtering method, a MBE method, a PLD method, a CVD method, or the like can be used. Also, as the substrate 44, for example, a single crystal MgO substrate or a single crystal $MgAl_2O_4$ substrate can be used.

For example, when a thin film in an amorphous state is formed at normal temperature on a substrate 44 formed from a single crystal MgO substrate, and then the thin film is subjected to a heat treatment, a thin film having the crystal structure of a full Heusler alloy can be formed. Alternatively, a thin film having the crystal structure of a full Heusler alloy may also be formed at the time of film-forming, by forming a film at a high temperature of, for example, 200° C. or higher.

Here, examples in which a thin film formed from a full Heusler alloy is formed on a single crystal MgO substrate using a magnetron sputtering method as a sputtering method, will be referred to Example 2 to Example 4 and described. The thin films formed in Example 2 to Example 4 were formed on single crystal MgO substrates and had a film thickness of 200 nm. Furthermore, in Example 2 to Example 4, thin films having the crystal structure of a full Heusler alloy were formed by forming a thin film in an amorphous state at normal temperature, and then subjecting the thin film to a heat treatment at 800° C.

In these Example 2 to Example 4 as well, similarly to Example 1, film forming was performed using a full Heusler alloy represented by the composition formula: $Fe_2TiAl$ as a sputtering target. However, in the present Example 2 to Example 4, unlike Example 1, a plurality of samples formed from thin films having different compositions was produced. Between these plurality of samples, the compositions of the thin films to be formed were adjusted by performing film formation in a state in which respectively different numbers of V chips or Fe chips were disposed on a sputtering target formed from a full Heusler alloy represented by the composition formula: $Fe_2TiAl$ (hereinafter, referred to as $Fe_2TiAl$ target).

Figure 13:
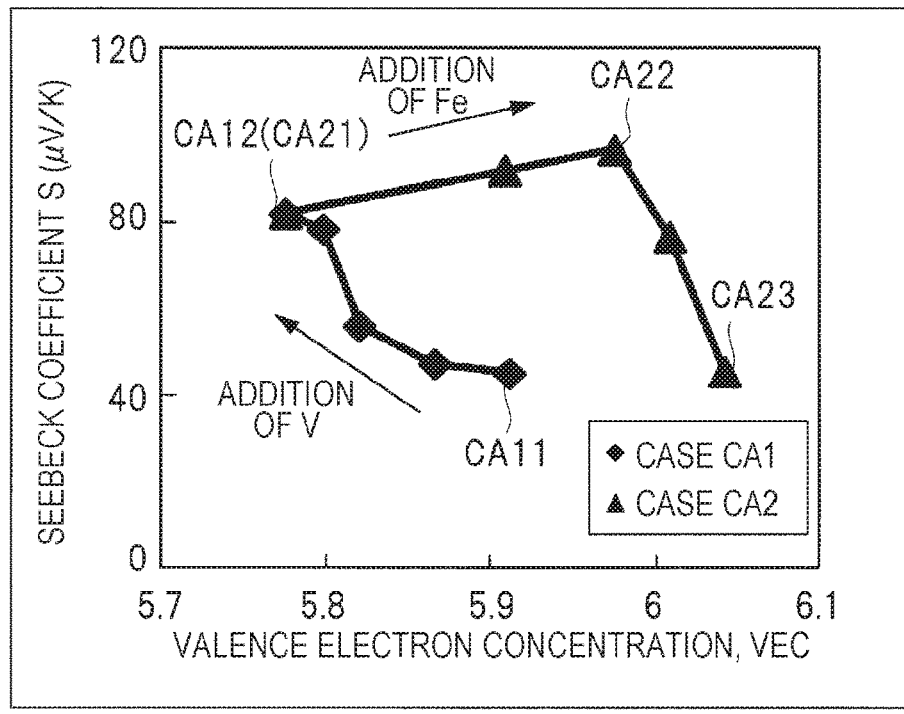
FIG. 13 is a graph showing the dependency of the Seebeck coefficient of a thin film formed in Example 2 on the valence electron concentration.

First, Example 2 will be described. FIG. 13 is a graph showing the dependency of the Seebeck coefficient of a thin film formed in Example 2, on the valence electron concentration. The two kinds of data shown in FIG. 13 respectively represent the case in which the amount of addition of V was changed (case CA1), and the case in which the amount of addition of Fe was changed in a state of having a fixed amount of addition of V (case CA2). Case CA1 shows the Seebeck coefficients S for the thin films as five samples, including from a sample having composition CA11 represented by the composition formula: $Fe_{2.18}Ti_{0.73}Al_{1.09}$, to a sample having composition CA12 represented by the composition formula: $Fe_{1.79}Ti_{0.60}V_{0.72}Al_{0.39}$. Case CA2 shows the Seebeck coefficients S for the thin films as five samples, including from a sample having composition CA21 represented by the composition formula: $Fe_{1.79}Ti_{0.60}V_{0.72}Al_{0.89}$, and a sample having composition CA22 represented by the composition formula: $Fe_{2.00}Ti_{0.54}V_{0.55}Al_{0.81}$, to a sample having composition CA23 represented by the composition formula: $Fe_{2.07}Ti_{0.52}V_{0.53}Al_{0.78}$.

In regard to the data of case CA1 shown in FIG. 13, when the amount of addition of V is increased from the composition CA11 to the composition CA12, along with an increase in the amount of addition of V, the Seebeck coefficient S increases, despite that the valence electron concentration, VEC, decreases in the range of less than 6. This is speculated to be because the energy gap increases as a result of a portion of Ti as the second element being substituted with V, as described above in Embodiment 1.

However, when only the amount of addition of V is increased, although the energy gap increases, the composition ratio of Fe, 2+α, is smaller than 2, and the valence electron concentration, VEC, is smaller than 6. Therefore, the Seebeck coefficient S cannot be made sufficiently large.

On the other hand, in regard to the data of case CA2 shown in FIG. 13, when the amount of addition of Fe was increased from the composition CA21 to the composition CA22, along with an increase in the amount of addition of Fe, the valence electron concentration, VEC, increased to be close to 6. In the composition CA22, the composition ratio of Fe as the first element, 2+α, becomes equal to 2, and about a half the amount of Ti as the second element has been substituted with V. At this time, the composition ratio of Al as the third element is adjusted such, that the valence electron concentration, VEC, becomes close to 6. Furthermore, in regard to the data of case CA2, when the amount of addition of Fe was increased from the composition CA21 to the composition CA22, the Seebeck coefficient S increased up to 100 μV/K along with an increase in the amount of addition of Fe.

The maximum value of the composition ratio of Fe, 2+α, in the data of case CA1 and case CA2 as shown in FIG. 13 is 2.18 for the composition CA11. On the other hand, the composition ratio of Fe, 2+α, in the composition CA22 is 2.00. Therefore, in regard to the data shown in FIG. 13, α in the full Heusler alloy represented by the above-mentioned composition formula (Formula 1) satisfies the relation: $0 \leq \alpha \leq 0.18$. However, when the data shown in FIG. 15 that will be described below is also included, α satisfies the relation: $0 \leq \alpha \leq 0.42$.

Next, Example 3 will be described. Also in this Example 3, similarly to Example 2, the compositions of the thin films to be formed were adjusted by performing film formation in a state in which respectively different numbers of V chips or Fe chips were disposed on a $Fe_2TiAl$ target. However, in Example 3, the compositions of the thin films to be formed were adjusted by performing film formation by changing the relative position of the sputtering target with respect to the substrate on which the thin film was to be formed.

Figure 14:
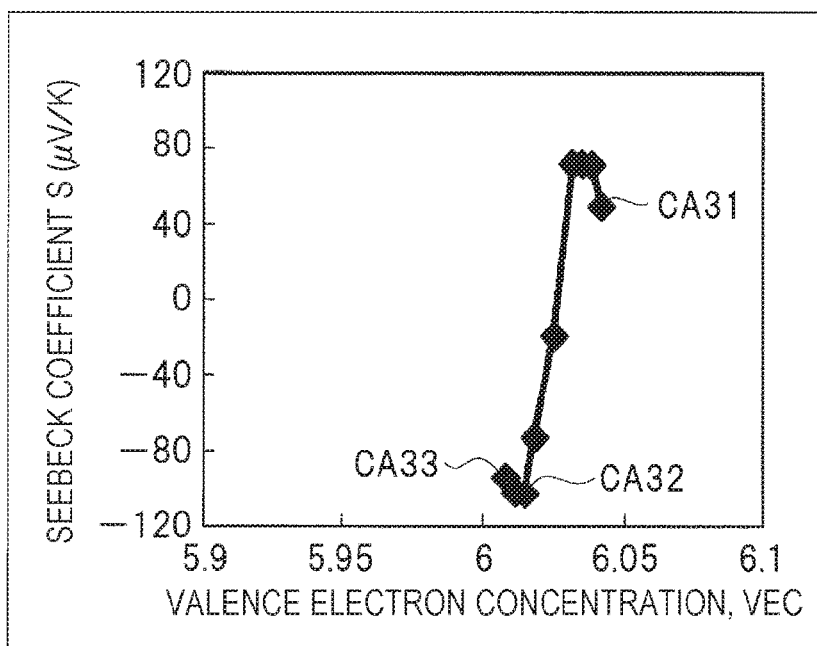
FIG. 14 is a graph showing the dependency of the Seebeck coefficient of a thin film formed in Example 3 on the valence electron concentration.

FIG. 14 is a graph showing the dependency of the Seebeck coefficient of a thin film formed in Example 3 on the valence electron concentration. The data shown in FIG. 14 show the Seebeck coefficients S for the thin films as a plurality of samples, including from a sample having composition CA31 represented by the composition formula: $Fe_{2.07}Ti_{0.52}V_{0.53}Al_{0.73}$, and a sample having composition CA32 represented by the composition formula: $Fe_{2.03}Ti_{0.56}V_{0.70}Al_{0.61}$, to a sample having composition CA33. In composition CA32, the composition ratio of Fe as the first element, 2+α, becomes larger than 2, and nearly half the amount of Ti as the second element has been substituted with V. At this time, the composition ratio of Al as the third element is adjusted such that the valence electron concentration, VEC, approaches 6.

Furthermore, in regard to the data shown in FIG. 14, when the composition was changed from composition CA31 to composition CA32, the Seebeck coefficient S decreased to −100 μV/K, and the absolute value of the Seebeck coefficient S increased up to 100 μV/K. From this, it is understood that by adjusting the composition of the thin film, to be formed, a thin film formed from an n-type thermoelectric conversion material instead of a p-type thermoelectric conversion material can be easily formed.

Next, Example 4 will be described. In this Example 4, unlike Example 2 and Example 3, the compositions of the thin films to be formed were adjusted by performing film formation in a state in which respectively different numbers of Cr chips, Mn chips, Fe chips, Co chips, or Si chips were disposed on a $Fe_2TiAl$ target.

Figure 15:
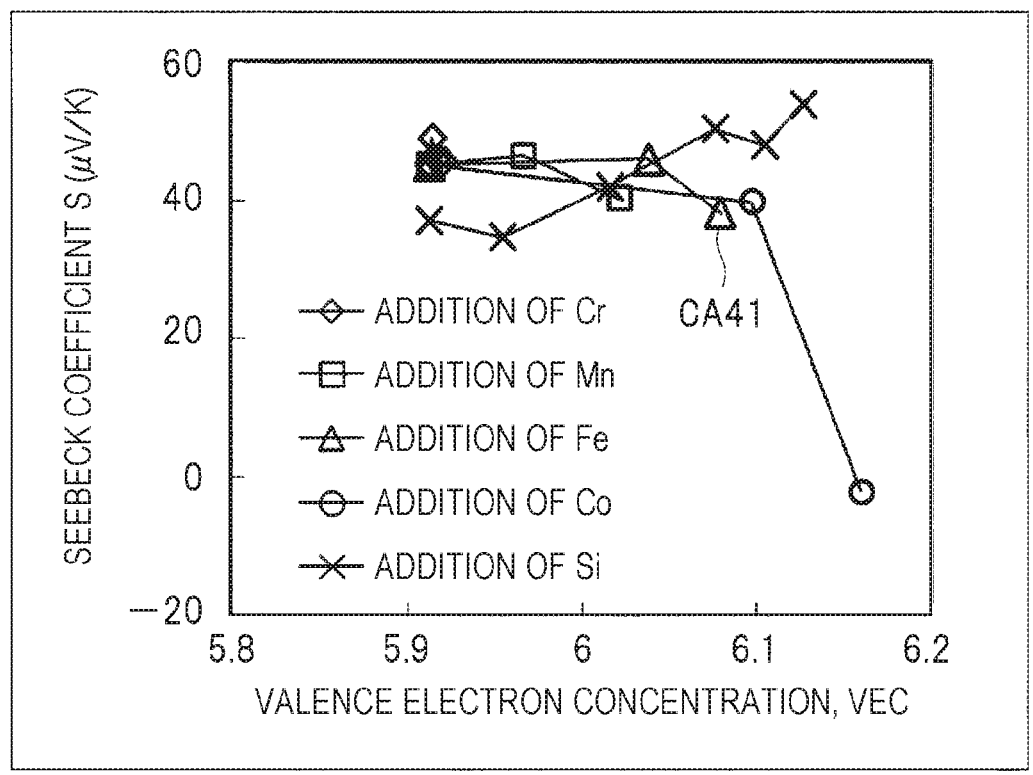
FIG. 15 is a graph showing the dependency of the Seebeck coefficient of a thin film formed in Example 4 on the valence electron concentration.

FIG. 15 is a graph showing the dependency of the Seebeck coefficient of a thin film formed in Example 4 on the valence electron concentration.

As shown in FIG. 15, in all of the cases of Cr addition, Mn addition, Fe addition, Co addition, and Si addition, the Seebeck coefficients S of the same level as that in the case of forming a film using a $Fe_2TiAl$ target only (composition CA11 in FIG. 13) were obtained. Furthermore, the data of FIG. 15 shows that when the valence electron concentration, VEC, satisfies the relation: $5.91 \leq VEC < 6.16$, the Seebeck coefficient S has a positive value, and the material functions as a thermoelectric conversion material.

Although not shown in the diagram, the same results are obtained also in a case in which any of Cr, Mn, Fe, Co and Si is added, in addition to any of V, Nb and Ta.

Furthermore, although not shown in the diagram, the same results are obtained also in a case in which at least one element selected from the group consisting of Group 13 elements except for Al, such as B, Ga and In; and Group 14 elements except for Si, such as C, Ge and Sn, is added in addition to any of V, Nb and Ta. Therefore, it is understood that full Heusler alloys respectively represented by the composition formula (Formula 1) function as thermoelectric conversion materials when the valence electron concentration, VEC, satisfy the relation: $5.91 \leq VEC < 6.16$.

Although not shown in the diagram, the same results are obtained also in a case in which at least one element selected from the group consisting of Group 7 elements except for Mn, Group 8 elements except for Fe, Group 9 elements except for Co, and Group 10 elements except for Ni, is added in addition to any of V, Nb and Ta. Therefore, it is understood that full Heusler alloys respectively represented by the composition formula (Formula 2) function as thermoelectric conversion materials when the valence electron concentration, VEC, satisfy the relation: $5.91 \leq VEC < 6.16$.

Although not shown in the diagram, the same results are obtained also in a case in which at least one element selected from the group consisting of Group 4 elements except for Ti, such as Zr and Hf; Group 6 elements except for Cr, such as Mo and W; and Group 7 elements except for Mn, is added in addition to any of V, Nb and Ta. Therefore, it is understood that full Heusler alloys respectively represented by the composition formula (Formula 3) function as thermoelectric conversion materials when the valence electron concentration, VEC, satisfy the relation: $5.91 \leq VEC < 6.16$.

As shown in FIG. 15, suitably, the valence electron concentration, VEC, satisfies the relation: $5.91 \leq VEC \leq 6.13$. Thereby, the Seebeck coefficients of the full Heusler alloys represented by the composition formula (Formula 1), the composition formula (Formula 2), the composition formula (Formula 3), and the composition formula (Formula 4), respectively, become higher than or equal to about 45 µV/K, which is the Seebeck coefficient of a full Heusler alloy composed of Fe, Ti and Al. Thus, those full Heusler alloys can be made to function more reliably as thermoelectric conversion materials.

Among the data obtained by Fe addition as shown in FIG. 15, in the composition CA41 having the maximum valence electron concentration, VEC, α is equal to 0.42. Therefore, in regard to the full Heusler alloys represented by the composition formula (Formula 1), the composition formula (Formula 2), the composition formula (Formula 3) and the composition formula (Formula 4), respectively, it is understood that the full Heusler alloys function as thermoelectric conversion materials when α satisfies the relation: $0 \leq \alpha \leq 0.42$. Also, suitably, in regard to the full Heusler alloys represented by the composition formula (Formula 1), the composition formula (Formula 2), the composition formula (Formula 3) and the composition formula (Formula 4), respectively, α satisfies the relation: $0 \leq \alpha \leq 0.21$. Thereby, the Seebeck coefficients of the full Heusler alloys represented by the composition formula (Formula 1), the composition formula (Formula 2), the composition formula (Formula 3), and the composition formula (Formula 4), respectively, become higher than or equal to about 45 µV/K, which is the Seebeck coefficient of a full Heusler alloy composed of Fe, Ti and Al. Thus, those full Heusler alloys can be made to function more reliably as thermoelectric conversion materials.

As discussed above, since the full Heusler alloy of the composition formula (Formula 1) contains Al as a main component of the third element, δ satisfies the relation: $0 \leq \delta < 0.5$. On the other hand, from the data obtained by Si addition as shown in FIG. 15, more suitably, in the full Heusler alloy represented by the composition formula (Formula 1), δ satisfies the relation: $0 \leq \delta \leq 0.4$. Thereby, the Seebeck coefficient of the full Heusler alloy represented by the composition formula (Formula 1) becomes higher than or equal to about 45 µV/K, which is the Seebeck coefficient of a full Heusler alloy composed of Fe, Ti and Al. Thus, this full Heusler alloy can be made to function more reliably as a thermoelectric conversion material.

It was found by a Rietveld analysis or the like that Cr, Mn and Co substitute a portion of Fe as the first element, and that Si substitutes a portion of Al as the third element. Furthermore, from the results shown in FIG. 15, even in a case in which the amounts of addition of Cr, Mn and Co, and of Si were changed, and thereby the valence electron concentration, VEC, was adjusted to be close to 6, the Seebeck coefficient S did not increase. That is, in the extent that the valence electron concentration, VEC, satisfies the relation: $5.91 \leq VEC < 6.16$, even if the amounts of addition of Cr, Mn, Co and Si are changed, the Seebeck coefficient S does not change noticeably. It is also found from these results that in order to increase the Seebeck coefficient S of a full Heusler alloy based on $Fe_2TiAl$ as a parent material, it is desirable to substitute a portion of Ti as the second element with an appropriate element such as V.

Also in a case in which a sintered body having the same composition as the compositions of the thin films of the respective samples of Example 2 to Example 4 is produced, results similar to the results shown in FIG. 13 to FIG. 15 are obtained. Therefore, the various numerical value ranges derived from. FIG. 13 to FIG. 15 are applicable not only to a thermoelectric conversion material as a thin film, but also to a thermoelectric conversion material as a sintered body.

Thus, the invention achieved by the present inventors has been specifically described based on embodiments thereof; however, the present invention is not intended to be limited to the embodiments described above, and it is needless to say that various modifications can be made as long as the gist of the invention is maintained.

INDUSTRIAL APPLICABILITY

The present invention is effective when applied to a thermoelectric conversion material.

REFERENCE SIGNS LIST

10, 20, 30, 40 thermoelectric conversion module
11, 31, 41 p-type thermoelectric conversion unit
12, 32, 42 n-type thermoelectric conversion unit
13, 13a, 13b, 13c, 23, 23a, 23b, 23c electrode 14, 24, 34 lower substrate
15, 25, 35 upper substrate
21 thermoelectric conversion unit
33, 33a, 33b, 33c, 43, 43a, 43b, 43c electrode
36 interlayer insulating film
44 substrate
CA11, CA12, CA21, CA22, CA23 composition
CA31, CA32, CA33, CA41 composition
PR1, PR2, PR3 part
RG1, RG2, RG3 region

The invention claimed is:

1. A thermoelectric conversion material comprising a full Heusler alloy represented by the following composition formula (Formula 1):

$$Fe_{2+\alpha}(Ti_{1-\beta}M1_{\beta})_{1-\alpha+\gamma}(Al_{1-\delta}M2_{\delta})_{1-\gamma} \quad \text{(Formula 1)}$$

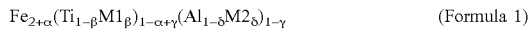

wherein M1 represents at least one element selected from the group consisting of V, Nb and Ta;

M2 represents at least one element selected from the group consisting of Group 13 elements except for Al and Group 14 elements;

$\alpha$ satisfies the relation: $0 < \alpha \leq 0.42$;

$\beta$ satisfies the relation: $0 \leq \beta < 0.75$;

$\delta$ satisfies the relation: $0 \leq \delta < 0.5$;

when the number of valence electrons of M1 is designated as m1, and the number of valence electrons of M2 is designated as m2, the VEC, which is the valence electron concentration per atom of the full Heusler alloy, is represented by the following mathematical formula (Expression 1) as a function of $\alpha$, $\beta$, $\gamma$, and $\delta$:

$$VEC(\alpha,\beta,\gamma,\delta)=[8\times(2+\alpha)+\{4\times(1-\beta)+m1\times\beta\}\times(1-\alpha+\gamma)+\{3\times(1-\delta)+m2\times\delta\}\times(1-\gamma)]/4 \quad \text{(Expression 1);}$$

and the VEC satisfies the relation: $5.91 \leq VEC < 6.16$.

2. The thermoelectric conversion material according to claim 1, wherein $\beta$ satisfies the relation: $0 \leq \beta \leq 0.625$.

3. The thermoelectric conversion material according to claim 1, wherein $\beta$ satisfies the relation: $0 < \beta < 0.375$.

* * * * *